United States Patent
Hosp et al.

(10) Patent No.: US 9,645,883 B2
(45) Date of Patent: May 9, 2017

(54) CIRCUIT ARRANGEMENT AND METHOD FOR REALIZING CHECK BIT COMPACTING FOR CROSS PARITY CODES

(71) Applicant: Infineon Technologies AG, Neubiberg (DE)

(72) Inventors: Sven Hosp, Potsdam (DE); Michael Goessel, Mahlow (DE); Klaus Oberlaender, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/492,204

(22) Filed: Sep. 22, 2014

(65) Prior Publication Data

US 2015/0089333 A1 Mar. 26, 2015

(30) Foreign Application Priority Data

Sep. 23, 2013 (DE) .................. 10 2013 219 088

(51) Int. Cl.
  H03M 13/00 (2006.01)
  G06F 11/10 (2006.01)
  H03M 13/19 (2006.01)

(52) U.S. Cl.
  CPC ......... *G06F 11/1004* (2013.01); *H03M 13/19* (2013.01); *H03M 13/6502* (2013.01)

(58) Field of Classification Search
  None
  See application file for complete search history.

(56) References Cited

U.S. PATENT DOCUMENTS

| 7,730,379 B2 * | 6/2010 | Chen ...................... G11B 20/18 714/755 |
| 2008/0175137 A1 * | 7/2008 | Tseng ............... G11B 20/10527 369/275.3 |

(Continued)

FOREIGN PATENT DOCUMENTS

| CN | 101231865 A | 7/2008 |
| CN | 102468855 A | 5/2012 |

OTHER PUBLICATIONS

Lin, S. and Costello, D. "Error Control Logic", Prentice Hall, 1983, pp. 79-81.

(Continued)

*Primary Examiner* — Daniel McMahon
(74) *Attorney, Agent, or Firm* — Eschweiler & Potashnik, LLC

(57) ABSTRACT

A circuit arrangement for determining m check bits $c_1, \ldots, c_m$ for k data bits $u_1, \ldots, u_k$ is provided, wherein the circuit arrangement includes a first subcircuit and a second subcircuit. The first subcircuit has k binary inputs for inputting the k data bits $u = u_1, \ldots, u_k$ and M binary outputs for outputting M binary intermediate values $z_1, \ldots, z_M$ determined from the data bits. The second subcircuit is configured to transform the intermediate values $z_1, \ldots, z_M$ into the check bits $c_1, \ldots, c_m$.

20 Claims, 6 Drawing Sheets

(56) References Cited

U.S. PATENT DOCUMENTS

2009/0073009 A1* 3/2009 Oda .................. H03M 13/2915
341/94
2011/0161774 A1 6/2011 Shin et al.
2014/0229786 A1* 8/2014 Poolakkaparambil G06F 11/1412
714/746

OTHER PUBLICATIONS

Lin, S. and Costello, D. "Error Control Coding", Prentice Hall, 1983, pp. 499-502.
Pflanz, M., Walther, K., Galke, C. and Vierhaus, H., "On-line Error Detection and Correction in Storage Elements with Cross-Parity Check", Proc. 8-th IOLTW, 2002, pp. 69-73.
Rubinoff, M., "N-dimensional Codes for Detecting and Correcting Multiple Errors", Comm of the ACM, 1961, pp. 545-551.
E. J. Wieder "N-dimensional Codes for Detecting Four Errors and Correcting Three", Master Thesis, Moore School of Electrical Engineering, Philadelphia, 1961, Chapter V, pp. 2-3.
M. J. Hsiao, D. C. Bossen, R. T. Chien "Orthogonal Latin Square Code", IBM Journal of Research and Development, vol. 14, issue 4, Jul. 1970.
Joachim Swoboda, "Codierung zur Fehlerkorrektur und Fehlererkennung" [Coding for error correction and error recognition], R. Oldenbourg Verlag Munich, 1973, ISBN 3-486-39371-5, pp. 12-15.

* cited by examiner

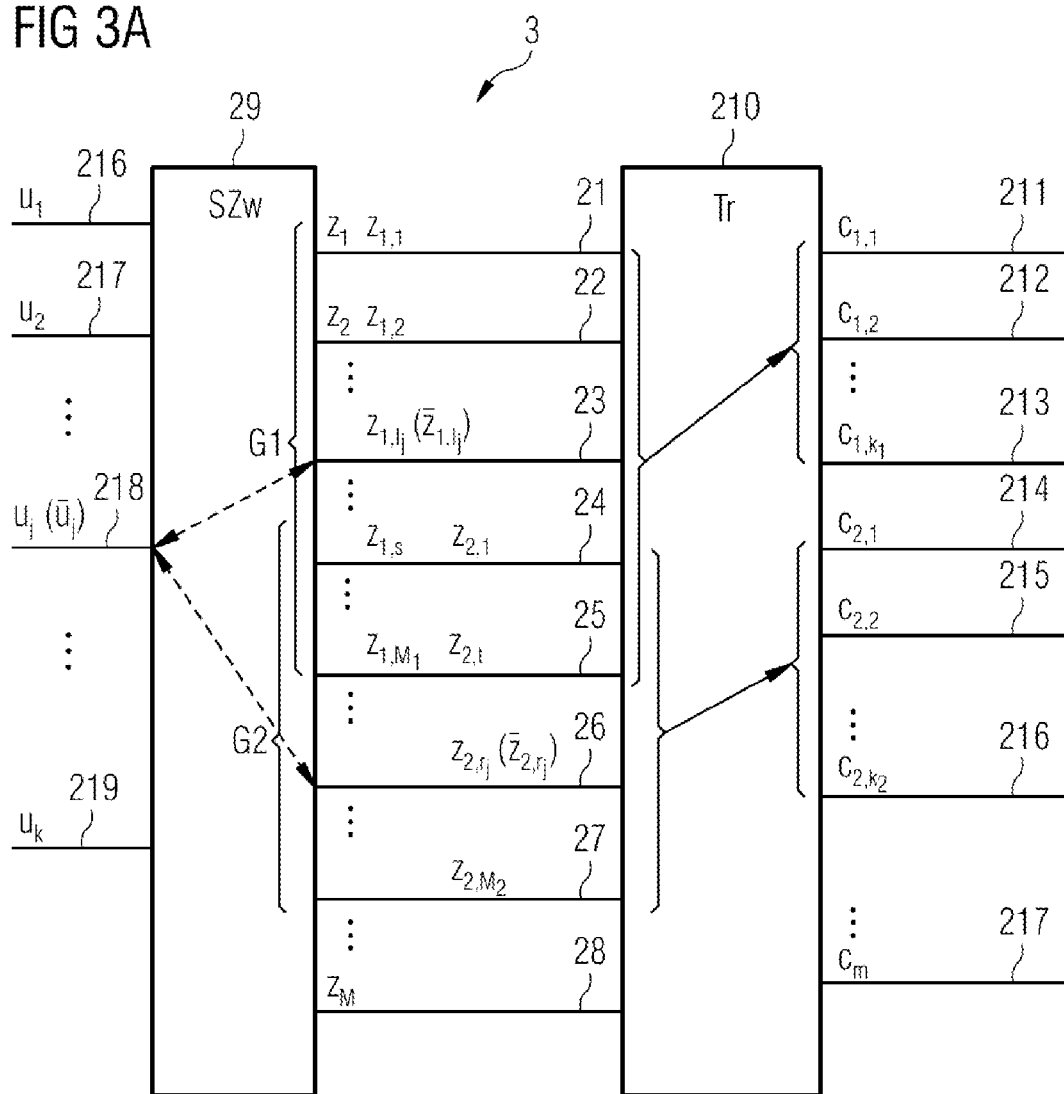

CIRCUIT ARRANGEMENT AND METHOD FOR REALIZING CHECK BIT COMPACTING FOR CROSS PARITY CODES

REFERENCE TO RELATED APPLICATION

This application claims priority to German application number 10 2013 219 088.3 filed on Sep. 23, 2013.

FIELD

The application relates to error detection, particularly error detection in semiconductor memories, and, specifically, to a circuit arrangement and a method for realizing check bit compacting for cross parity codes.

BACKGROUND

The prior art discloses the practice of correcting arbitrary 1-bit errors in binary sequences of a particular length n, for example by means of Hamming codes. This is described in Lin, S. and Costello, D. "Error Control Logic", Prentice Hall, 1983, pp. 79-81, for example.

If, besides the correction of 1-bit errors, 2-bit errors are also recognized, it is possible to use what are known as Hsiao codes, see Lin, S. and Costello, D. "Error Control Coding", Prentice Hall, 1983, pp. 499-502, for example.

For Hamming codes, the number m of check bits is approximately equal to $m \approx \log_2(k)$, when k is the number of data bits, so that $n = k+m$. The error correction is known to take place such that first of all a m-component error syndrome is determined from the possibly disrupted data bits and check bits. The m-dimensional error syndrome is then assigned the bit to be corrected that corresponds to the error syndrome by a decoder.

In the case of Hsiao codes, the error correction is likewise effected by the determination of an error syndrome and by a decoder. The number of check bits is one bit greater than for Hamming codes. If the syndrome has an uneven number of ones, a 1-bit error is corrected; if the syndrome has an even number of ones, a 2-bit error is recognized.

The error correction by means of Hamming codes and Hsiao codes is too slow for special applications.

Faster correction, for example of 1-bit errors, is permitted by cross parity codes (for example see: Pflanz, M., Walther, K., Galke, C. and Vierhaus, H., "On-line Error Detection and Correction in Storage Elements with Cross-Parity Check", Proc. 8-th IOLTW, 2002, pp. 69-73 and Rubinoff, M., "N-dimensional Codes for Detecting and Correcting Multiple Errors", Comm of the ACM, 1961, pp. 545-551). In the case of these codes, the k data bits are arranged in a rectangular or square array, sometimes also a multidimensional array. On account of the relatively simple description, we assume here that the data are notionally arranged in a rectangular or square two-dimensional array comprising rows and columns. Each data bit is then located precisely in one row and precisely in one column. By way of example, the check bits used can then be the row and column parities. If k is a square number, such as $64 = 8^2$, then $\sqrt{k} = m'$ row parities and $\sqrt{k} = m'$ column parities can be used, so that in this case $m = 2 \cdot m' = 2 \cdot \sqrt{k}$ check bits are required.

If the total parity is furthermore used as an additional check bit, $m = 2 \cdot \sqrt{k} + 1$ check bits are obtained. For 64 data bits, 17 check bits are then required.

In comparison with the number of 7 checks bits that is required for a Hamming code with 64 data bits, this number is large. To some extent, the error correction is much faster for cross parity codes than for Hamming codes, however.

1-Bit errors in memories or on buses are thus corrected by 1-bit-error-correcting codes. According to the prior art, this is thus usually effected by a Hamming code, if only the correction of 1-bit errors is required, or by a Hsiao code, if, besides the 1-bit error correction, 2-bit error detection is also necessary. If k is the number of data bits, approximately log(k) check bits are required for these codes. For Hamming and Hsiao codes, the number of check bits is an optimum.

The decoding that is effected by means of syndrome determination and decoder takes too long a time in various applications, on account of the circuit depth prescribed by the code.

Alternatively, the correction of 1-bit errors and the detection of 2-bit errors can, as already discussed, be performed by cross parity codes. In this case, the data bits are notionally arranged as a (usually) square array, and the check bits are the row parities and the column parities (and possibly also diagonal parities) of the array.

In this case, the number of check bits is approximately $2\sqrt{k}$, which is much greater than $\log(k)$, particularly when k is relatively large. Thus, 17 check bits are required for a cross parity code with 64 data bits (with total parity included), while a Hsiao code requires only 8 check bits.

However, error correction by means of cross parity codes is much faster than by means of Hamming codes or Hsiao codes.

The error correction is particularly time-critical, since the data can be processed further only after they have been corrected.

In order to be able to observe the requisite clock times, some circuits have involved the use of cross parity codes at particular time-critical points, for example, which replace the initially provided Hsiao codes.

If the requisite time for correcting an error by means of a Hamming code is even just slightly too long to be able to be executed in the current clock cycle, it is possible for a cross parity code to be used instead of a Hamming code, said cross parity code being able to execute the requisite error correction in the current clock cycle.

However, a drawback in this case is that the number of check bits increases abruptly, even though there may be a need for just slight shortening of the time for the error correction. Thus, in the case of 64 data bits, for example, it is necessary to use 17 check bits for a cross parity code instead of the 7 check bits for a Hamming code, even though there may be a need for just a little shortening of the time for the error correction.

To date, there is only the option of choosing between Hamming or Hsiao codes and cross parity codes.

Thus, if the requisite clock time means that it is necessary to decide on a cross parity code, the number of check bits and hence the hardware complexity rise abruptly. This is the case even if an Hsiao code requires a time involvement for decoding that is only just above the necessary clock time.

It would be desirable to determine codes that can be adjusted to suit the requisite clock time for the decoding and at the same time have as small a number of check bits as possible.

SUMMARY

In one embodiment of the present disclosure it is a goal to provide improved concepts for error detection.

A circuit arrangement according to claim 1, a decoder according to claim 16, and a method according to claim 20 are provided.

A circuit arrangement for determining m check bits $c_1, \ldots, c_m$ for k data bits $u_1, \ldots, u_k$ is provided. The circuit arrangement comprises a first subcircuit having k binary inputs for inputting the k data bits $u=u_1, \ldots, u_k$ and M binary outputs for outputting M binary intermediate values $z_1, \ldots, z_M$ determined from the data bits, and a second subcircuit for transforming the intermediate values $z_1, \ldots, z_M$ into the check bits $c_1, \ldots, c_m$, where m<M. The first subcircuit is designed to determine the intermediate values from the data bits such that there is an association between a determined pair of intermediate values $z_{1,l_j}, z_{2,m_j}$ for each data bit $u_j$ that is to be corrected, so that a change in the pair $z_{1,l_j}, z_{2,m_j}$ to $\overline{z}_{1,l_j}, \overline{z}_{2,m_j}$ when only one data bit from the data bits $\{u_1, \ldots, u_k\}$ has changed to its negated value indicates that the j-th data bit $u_j$ has changed to $\overline{u}_j$, wherein the second subcircuit is designed such that it transforms the intermediate values into check bits such that the check bits associated with the intermediate values determined from the data bits $u_1, \ldots, u_i, \ldots, u_k$ and the check bits associated with the intermediate values determined from the data bits inverted in a respective bit from the data bits that are to be corrected differ in pairs, where m<M and M<k.

By way of example, in one specific embodiment, the intermediate values and/or the check bits determined from the intermediate values by the second subcircuit may each be check bits from an at least 1-bit-error-correcting code.

Furthermore, a decoder for determining a subset of data bits that are to be corrected on the basis of m check bits $c_1, \ldots, c_m$ is provided, wherein the m check bits $c_1, \ldots, c_m$ are determined by a circuit arrangement for determining the check bits $c_1, \ldots, c_m$ for k data bits $u_1, \ldots, u_k$. The decoder comprises a third subcircuit, a fourth subcircuit and a fifth subcircuit. The third subcircuit $S_{syndrome}$ is designed to form a subset of differences $\Delta c_1 = c_1 \oplus c_1', \ldots, \Delta c_m = c_m \oplus c_m'$ for the correct check bits $c_1, \ldots, c_m$ and the possibly erroneous check bits $c_1', \ldots, c_m'$, wherein these differences are determined from possibly erroneous data bits $u_1, \ldots, u_k$ and possibly erroneous check bits $c_1', \ldots, c_m'$. The fourth subcircuit Decomp is designed to form a subset of differences $\Delta z_1 = z_1 \oplus z_1', \ldots, \Delta z_M = z_M \oplus z_M'$ from error-free intermediate values $z_1, \ldots, z_M$ and possibly erroneous intermediate values $z_1', \ldots, z_M'$, the differences $\Delta z_1, \ldots \Delta z_M$ being determined from the differences in the intermediate values $\Delta c_1, \ldots, \Delta c_m$. The fifth subcircuit Corr is designed to determine a corrected data bit $u_j^{cor}$. In this case, the fifth subcircuit Corr contains at least three binary inputs for inputting a possibly erroneous data bit $u'_j$ and for inputting two differences $\Delta z_{1,l_j}, \Delta z_{2,r_j}$ for intermediate values and a binary output for outputting the corrected data bit $u_j^{cor}$, wherein $z_{1,l_j}$ belongs to a first group of intermediate values and $z_{2,r_j}$ belongs to a second group of intermediate values, so that when $u_j$ changes to $\overline{u}_j$ and also no error occurs, $z_{1,l_j}$ changes to $\overline{z}_{1,l_j}$ and $z_{2,r_j}$ changes to $\overline{z}_{2,r_j}$ and the fifth subcircuit Corr is designed such that it outputs $u_j^{cor} = u_j \oplus 1$ when $\Delta z_{1,l_j} = \Delta z_{2,r_j} = 1$.

In addition, a system is provided. The system comprises the circuit arrangement described above for determining m check bits $c_1, \ldots, c_m$ for k data bits, and the decoder described above for determining a subset of data bits that are to be corrected.

Furthermore, a method for determining m check bits $c_1, \ldots, c_m$ for k data bits $u_1, \ldots, u_k$ is provided. The method comprises:

determination of M intermediate values from the k data bits, so that there is an association between a determined pair of intermediate values $z_{1,l_j}, z_{2,m_j}$ for each data bit $u_j$ that is to be corrected, and:

transformation of the intermediate values $z_1, \ldots, z_M$ into the check bits $c_1, \ldots, c_m$.

A change in the pair $z_{1,l_j}, z_{2,m_j}$ to $\overline{z}_{1,l_j}, \overline{z}_{2,m_j}$ when only one data bit from the data bits $\{u_1, \ldots, u_k\}$ has changed to its negated value indicates that the j-th data bit $u_j$ has changed to $\overline{u}_j$, wherein the intermediate values are transformed into check bits such that the check bits associated with the intermediate values determined from the data bits $u_1, \ldots, u_i, \ldots, u_k$ and the check bits associated with the intermediate values determined from the data bits inverted in a respective bit from the data bits that are to be corrected differ in pairs, where m<M and M<k.

In addition, a method for determining a subset of data bits that are to be corrected on the basis of m check bits $c_1, \ldots, c_m$ is provided, wherein the method for determining the subset of the data bits that are to be corrected comprises:

formation of a subset of differences $\Delta c_1 = c_1 \oplus c_1', \ldots, \Delta c_m = c_m \oplus c_m'$ for the correct check bits $c_1, \ldots, c_m$ and the possibly erroneous check bits $c_1', \ldots, c_m'$, these differences being determined from possibly erroneous data bits $u_1', \ldots, u_k'$ and possibly erroneous check bits $c_1', \ldots, c_m'$, formation of a subset of differences $\Delta z_1 = z_1 \oplus z_1', \ldots, \Delta z_M = z_M \oplus z_M'$ from error-free intermediate values $z_1, \ldots, z_M$ and possibly erroneous intermediate values $z_1', \ldots, z_M'$, the differences $\Delta z_1, \ldots \Delta z_M$ being determined from the differences in the intermediate values $\Delta c_1, \ldots, \Delta c_m$, and determination of a corrected data bit $u_j^{cor}$ on the basis of a possibly erroneous data bit $u'_j$ and two differences $\Delta z_{1,l_j}, \Delta z_{2,r_j}$ in intermediate values, wherein $z_{1,l_j}$ belongs to a first group of intermediate values and $z_{2,r_j}$ belongs to a second group of intermediate values, so that when $u_j$ changes to $\overline{u}_j$ and no further error occurs, $z_{1,l_j}$ changes to $\overline{z}_{1,l_j}$ and $z_{2,r_j}$ changes to $\overline{z}_{2,r_j}$ and wherein $u_j^{cor} = u_j \oplus 1$, when $\Delta z_{1,l_j} = \Delta z_{2,r_j} = 1$.

In addition, a computer program having a program code for performing one of the methods described above is provided.

Embodiments overcome or reduce the disadvantages of known solutions and allow the number of check bits from a code to be matched in the best possible way to the required speed of decoding.

In one embodiment, this involves transformation or compacting of, by way of example, M check bits for a first code $C_1$ with k data bits $u_1, \ldots, u_k$ into m check bits $c_1, \ldots, c_m$ of a code $C_2$ with the same data bits that is derived from the first code. In order to clarify that check bits from the second code are derived from the check bits of the first code, the M check bits of the first code are referred to as intermediate values $z_1, \ldots, z_M$.

If both $C_1$ and the code $C_2$ derived therefrom are an at least 1-bit-error-correcting code, then a change in the intermediate values $z_1, \ldots, z_M$ and a change in the check bits $c_1, \ldots, c_m$ correspond on a one-to-one basis to a 1-bit error in a data bit, for example. As stated, the intermediate values $z_1, \ldots, z_M$ are transformed into check bits $c_1, \ldots, c_m$, the transformation being effected according to one embodiment such that a change in the check bits $c_1, \ldots, c_m$ corresponds to a change in the intermediate values $z_1, \ldots, z_M$ that is caused by a 1-bit error. This property is particularly advantageous for the decoding and error correction.

For the decoding, it is then first of all possible to determine the relevant change in the intermediate values from a present change in the check bits $c_1, \ldots, c_m$ and then to realize a simple correction circuit in line with the first code $C_1$ from the change in the intermediate values. M>m. Depending on the degree of compacting of the intermediate values into check bits, i.e. depending on the realized difference between M and m, the number of requisite check bits is decreased from M to m to a greater or lesser extent. In this case, heavier compacting requires a longer time that is necessary for compacting and decoding and particularly for error correction. It is thus possible to match the required involvement of check bits and the required speed for error correction to one another, which is advantageous.

In this case, the first code $C_1$ may be a cross parity code, with row and column parities being used as intermediate values $z_1, \ldots, z_M$, for example. Particularly for 1-bit errors in the data bits, it is possible for simple and fast decoders and error correctors to be specified for cross parity codes.

The intermediate values, which are row and column parities of the data bits arranged as an array in the case of a cross parity code, are transformed or compacted into check bits of the code used according to one embodiment.

A 1-bit error in the data bits is then reflected in a change in the check bits $c_1, \ldots, c_m$, from which change a change in the intermediate values, i.e. a change in the row and column parities, e.g. the change in a bit of the row parities and in a bit of the column parities, is determined. From the changes in the bits of the intermediate values, the correction value for the corrupted data bit is then determined in a simple manner, in this case by ANDing the relevant row and column parities, as in the case of a cross parity code.

It is not necessary for the first code to be a cross parity code. In other embodiments, the first code is not a cross parity code but rather a different code, such as a Latin Square Code (see [6]), e.g. an orthogonal Latin Square Code (see [6]).

According to some embodiments, the first code has a first group of intermediate values and a second group of intermediate values, the intermediate values being determined from the data bits such that a 1-bit error in a data bit has an association between a determined pair of intermediate values, wherein the first intermediate value belongs to the first group and the second intermediate value belongs to the second group of intermediate values. If the relevant data bit changes, e.g. erroneously, then the values of the intermediate values associated with this data bit change.

In some embodiments, the check bits of the cross parity code are compacted during the coding and decompacted during the decoding and error correction, so that—in comparison with the cross parity code—fewer check bits need to be stored.

The degree of compacting firstly determines how many check bits are required and secondly determines how much time the decoding requires. Heavier compacting corresponds to a longer correction time.

It is particularly advantageous that some embodiments allow (step-by-step) scaling between the Hsiao code and the cross parity code, and the determination of codes that meet the necessary time criteria for the error correction with as small a number of check bits as possible. This means that the requisite hardware complexity can be matched to the demanded time limit.

In principle, it is also possible for 2-bit correcting codes to be matched to requisite time limits of the clock.

Some embodiments are based on a principle that is described here for 1-bit errors in the data bits. A description of the correction of 2-bit errors and the detection of 2-bit and 3-bit errors is presented further below.

In general, the check bits of the cross parity code are considered to be intermediate values from which the check bits of the sought code are formed by compacting. This allows the number of check bits that need to be stored to be reduced.

In this case, simple, relatively low compacting allows simple decompacting that can be performed quickly. More complex, heavier compacting generally requires more time for decompacting. Depending on the time available for decoding, it is possible, within certain limits, for the degree of compacting and hence the involvement for storing check bits to be matched to the time conditions.

For compacting, the check bits of a relevant cross parity code are divided into groups such that each 1-bit error in the data bits changes precisely one bit into two groups of check bits of the cross parity code. By way of example, the check bits in such groups are the row parities and the column parities of the intended data array. (For the purpose of simpler description, only groups of the row and column parities are considered to be groups of check bits from the cross parity code in this case, although other groups of check bits are also possible). The row parities and the column parities are the intermediate values that are compacted into check bits of the sought code. This decreases the number of check bits required in comparison with the cross parity code.

The compacting is effected such that changes in the row parities that correspond to a 1-bit error in the data bits reflect changes in the associated check bits, so that the changes in the row parities are again determined from the changes in the check bits. The column parities are handled in the same way. In this case, the compacting is performed in linear or else nonlinear fashion. After the check bits have been decompacted into the intermediate values, which are the check bits of a cross parity code, the correction is very simple, as in the case of a cross parity code.

The procedure is described for the correction of 1-bit errors, the correction of 1-bit errors and the detection of 2-bit errors, the correction of 2-bit errors and the correction of 2-bit errors and the detection of 3-bit errors.

In order to make the description as simple and clear as possible, it is assumed here that the 1-bit errors arise only in the region of the useful data bits.

For a simple example embodiment, the check bits of a cross parity code are compacted for 16 useful data bits. Notionally, these 16 useful data bits are distributed over an array containing 4 rows and 4 columns.

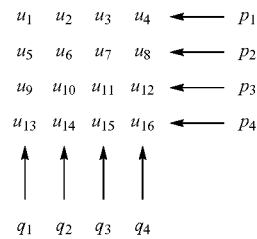

Each of these rows and columns is protected by a parity, which is the intermediate values in the text below. The parities of the rows are denoted by $p_i$ and those of the columns are denoted by $q_j$, where $1 \leq i, j \leq 4$. The equations for calculating the parities are $p_1 = u_{01} + u_{02} + u_{03} + u_{04}$ $p_2 = u_{05} + u_{06} + u_{07} + u_{08}$ $p_3 = u_{09} + u_{10} + u_{11} + u_{12}$ $p_4 = u_{13} + u_{14} + u_{15} + u_{16}$ $q_1 = u_{01} + u_{05} + u_{09} + u_{13}$ $q_2 = u_{02} + u_{06} + u_{10} + u_{14}$ $q_3 = u_{03} + u_{08} + u_{11} + u_{15}$ $q_4 = u_{04} + u_{08} + u_{12} + u_{16}$ It should be noted that the addition is addition in binary, i.e. is addition modulo 2.

From the equations it is possible to read that each useful data bit is used in the calculation of precisely one row parity and one column parity. Therefore, by way of example, if an error occurs in one bit from the useful data bits, for example $u_5$, then only the results of the equations for $p_2$ and $q_1$ change. The error can thus be located when decoding using the row and column parities and can easily be corrected by an AND gate.

For compacting, a total of two groups $G_1$ and $G_2$ are formed and the parities, referred to as intermediate values in the text below, are distributed over these groups. The row intermediate values $p_i$ are associated with group $G_1$ and the column intermediate values $q_j$ are associated with the group $G_2$, where $1 \le i,j \le 4$ $G_1 = \{p_1, p_2, p_3, p_4\}$ $G_2 = \{q_1, q_2, q_3, q_4\}$ As a final step, the intermediate values $p_1$, $p_2$, $p_3$, $p_4$, $q_1$, $q_2$, $q_3$ and $q_4$ from the groups $G_1$ and $G_2$ are transformed into the check bits $c_{1,1}$, $c_{2,1}$, $c_{3,1}$, $c_{1,2}$, $c_{2,2}$ and $c_{3,2}$ of the codes used. In both groups, the 4 intermediate values are compacted onto 3 check bits in each case. This compacting is performed such that the check bits $c_{1,j}$, $c_{2,j}$, $c_{3,j}$ associated with the intermediate values $z_{1,j}$, $z_{2,j}$, $z_{3,j}$, $z_{4,j}$, where $z_{i,j} \in G_j$, $1 \le i \le 4$, $j \in \{1,2\}$, from the intermediate values inverted in a respective bit differ from one another in pairs.

The equations used for calculating these six check bits may be the following equations $c_{1,1} = p_1 + p_4$ $c_{2,1} = p_2 + p_4$ $c_{3,1} = p_3 + p_4$ For $c_{1,1}$, the intermediate values $p_1$ and $p_4$ are added. In addition, for $c_{2,1}$, the intermediate values $p_2$ and $p_4$ are added and for $c_{3,1}$, the intermediate values $p_3$ and $p_4$ are added. Similarly, the intermediate values from the second group $G_2$, are compacted $c_{1,2} = q_1 + q_4$ $c_{2,2} = q_2 + q_4$ $c_{3,2} = q_3 + q_4$ The individual equations for compacting the intermediate values can also be regarded as a compaction matrix in the form of a check matrix H from a Hisao code.

$$H = \begin{pmatrix} 1 & 0 & 0 & 1 \\ 0 & 1 & 0 & 1 \\ 0 & 0 & 1 & 1 \end{pmatrix}$$

In general, in this example, $z_{4,j}$ is added to each of $z_{1,j}$, $z_{2,j}$ and $z_{3,j}$, where $z_{i,j} \in G_j$, $1 \le i \le 4$, $j \in \{1,2\}$. The following list shows the association of the intermediate values with the individual check bits. In this case, the following is always true $z_{1,j} z_{2,j} z_{3,j} z_{4,j} \rightarrow c_{1,j} c_{2,j} c_{3,j}$ The mappings are

| | | | |
|---|---|---|---|
| 0000 → 000 | 0100 → 010 | 1000 → 100 | 1100 → 110 |
| 0001 → 111 | 0101 → 101 | 1001 → 011 | 1101 → 001 |
| 0010 → 001 | 0110 → 011 | 1010 → 101 | 1110 → 111 |
| 0011 → 110 | 0111 → 100 | 1011 → 010 | 1111 → 000 |

It can be seen from the mappings that the check bits associated with the intermediate values and the check bits associated with the intermediate values inverted in one bit differ from one another in pairs. By way of example, the intermediate value 0000 is transformed into 000, while 0001 is transformed into 111, 0010 is transformed into 001, 0100 is transformed into 010 and 1000 is transformed into 100.

A further advantage of this variant is the decoder. For 1-bit error correction, it is not necessary, as in the case of normal Hsiao code, for the complete syndrome to be taken into account for the correction of a single data bit. Instead, it is possible to use just parts of this syndrome, as is usual in the case of cross parity code.

The procedure for decoding may now be that first of all the changes in the bits $c_{1,1}$, $c_{2,1}$, $c_{3,1}$, $c_{1,2}$, $c_{2,2}$, $c_{3,2}$ are decompacted to produce the changes in the parities $\Delta p_1, \ldots, \Delta p_4, \Delta q_1, \ldots, \Delta q_4$. For decompacting the syndrome, it is possible to use the following equations $\Delta p_1 = \Delta c_{1,1} \wedge \neg (\Delta c_{2,1} \wedge \Delta c_{3,1})$ $\Delta p_2 = \Delta c_{2,1} \wedge \neg (\Delta c_{1,1} \wedge \Delta c_{3,1})$ $\Delta p_3 = \Delta c_{3,1} \wedge \neg (\Delta c_{1,1} \wedge \Delta c_{2,1})$ $\Delta p_4 = \Delta c_{1,1} \wedge \Delta c_{2,1} \wedge \Delta c_{3,1}$ $\Delta q_1 = \Delta c_{1,2} \wedge \neg (\Delta c_{2,2} \wedge \Delta c_{3,2})$ $\Delta q_2 = \Delta c_{2,2} \wedge \neg (\Delta c_{1,2} \wedge \Delta c_{3,2})$ $\Delta q_3 = \Delta c_{3,2} \wedge \neg (\Delta c_{1,2} \wedge \Delta c_{2,2})$ $\Delta p_4 = \Delta c_{1,2} \wedge \Delta c_{2,2} \wedge \Delta c_{3,2}$ For correcting a single data bit, the syndrome component of the row and the column in which the data bit is logically located can be logically combined by an AND gate, and the result can be linked to the read data bit using an XOR gate. This is shown in FIG. 8 for the correction of the bit $u_2$.

The equations for correction of the data bits are therefore as follows $u_1 = u'_1 + (\Delta p_1 \wedge \Delta q_1)$ $u_2 = u'_2 + (\Delta p_1 \wedge \Delta q_2)$ $u_3 = u'_3 + (\Delta p_1 \wedge \Delta q_3)$ $\vdots$ $u_{16} = u'_{16} + (\Delta p_4 \wedge \Delta q_4)$ This kind of reduction of the check bits can be performed for cross parity codes for 1-bit error correction and 2-bit error detection and also for cross parity codes for 2-bit error correction and 3-bit error detection.

Further embodiments can be found in the dependent claims.

BRIEF DESCRIPTION OF THE DRAWINGS

Embodiments are now described with reference to the drawings.

The illustrations of the drawings are as follows:

FIG. 3A shows a circuit arrangement with overlapping groups of intermediate values according to an embodiment.

DETAILED DESCRIPTION

Figure 1:
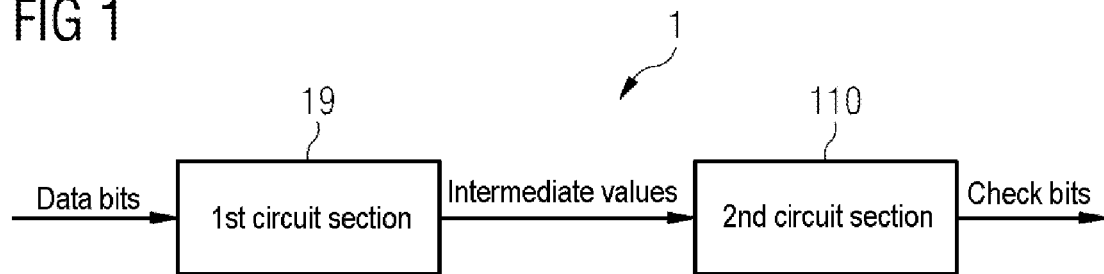
FIG. 1 shows a circuit arrangement according to an embodiment.

FIG. 1 shows a circuit arrangement 1 for determining m check bits $c_1, \ldots, c_m$ for k data bits $u_1, \ldots, u_k$ according to an embodiment.

The circuit arrangement 1 comprises a first subcircuit 19 having k binary inputs for inputting the k data bits $u=u_1, \ldots, u_k$ and M binary outputs for outputting M binary intermediate values $z_1, \ldots, z_M$ determined from the data bits.

In addition, the circuit arrangement 1 comprises a second subcircuit 110 for transforming the intermediate values $z_1, \ldots, z_M$ into the check bits $c_1, \ldots, c_m$, where m<M.

The first subcircuit 19 is designed to determine the intermediate values from the data bits such that there is an association between a determined pair of intermediate values $z_{1,l_j}, z_{2,m_j}$ for each data bit $u_j$ that is to be corrected, so that a change in the pair $z_{1,l_j}, z_{2,m_j}$ into $\bar{z}_{1,l_j}, \bar{z}_{2,m_j}$ when only one data bit from the data bits $\{u_1, \ldots, u_k\}$ has changed to its negated value indicates that the j-th data bit $u_j$ has changed to $\bar{u}_j$.

The second subcircuit 110 is designed such that it transforms the intermediate values into check bits such that the check bits associated with the intermediate values $z_1(u_1, \ldots, u_i, \ldots, u_k), \ldots, z_M(u_1, \ldots, u_i, \ldots, u_k)$ determined from the data bits $u_1, \ldots, u_i, \ldots, u_k$ and the check bits associated with the intermediate values determined from the data bits inverted in a respective bit from the data bits that are to be corrected differ in pairs, where m<M and M<k.

A few principles that are relevant to at least some of the embodiments will first of all be provided below.

Errors, that is to say erroneous bits in a binary sequence, for example, can be recognized and corrected using error recognizing and error correcting codes. By way of example, the use of Hamming codes and Hsiao codes is known.

A code C can be used to code data bits $u=u_1, \ldots, u_k$ into a code word $v=v_1, \ldots, v_n$. In this case, the binary sequence u of the data bits can also be regarded as a k-component data vector and the code word v can also be regarded as an n-component code vector. For a linear code, it is possible for a data vector $u=u_1, \ldots, u_k$ to be coded into a corresponding code vector $v=v_1, \ldots, v_n$ using a generator matrix G with k rows and n columns, i.e. with a (k,n) matrix G such that $$v = u \cdot G \qquad (1)$$

is determined. In this case, u and v are row vectors here. Vectors are known to be able to be presented both as row vectors and as column vectors. If a matrix is multiplied by a vector from the left, the vector is a row vector and the result of the multiplication is likewise a row vector. If a matrix is multiplied by a vector from the right, the vector is a column vector and the result of the modification is likewise a column vector. It is then clear from the context whether a vector can be regarded as a row vector or a column vector.

If the aim is particularly to point out that a vector w is presented as a column vector, then it needs to be denoted by $w^T$.

Error correction and error detection can take place using a H matrix H, which is an (in, n) matrix where m=n−k.

If a code vector $v=v_1, \ldots, v_n$ is determined from a data vector $u=u_1, \ldots, u_k$ in accordance with equation (1) and if the bits of this vector are disrupted, for example by alpha radiation, to produce an erroneous vector $v'=v_1', \ldots, v_n'$, then an error syndrome $s=s_1, \ldots, s_m$ may be determined as $$s = H \cdot v' \qquad (2).$$

In this case, the H matrix H is determined such that, for a code word v, $$0 = H \cdot v \qquad (3).$$

If v' and v differ by an error vector $e=e_1, \ldots, e_n$, so that $$e = e_1, \ldots, e_n = v_1 + v_1', \ldots, v_n + v_n' \qquad (4),$$

then $$s = H \cdot e \qquad (5).$$

If C is a 1-bit-error-correcting code, a different error syndrome $s^1, s^2, \ldots, s^n$ is associated with each 1-bit error, i.e. each of the n error vectors [1, 0, ..., 0], [0, 1, 0, ..., 0], ..., [0, ..., 0, 1].

A decoder can then associate the relevant bit that needs to be corrected or to be inverted with each of the error syndromes $s^1, s^2, \ldots, s^n$.

If C is a 2-bit error correcting code, each 1-bit error and each 2-bit error has a different associated error syndrome.

If the code C is a Hamming code, all the columns of the H matrix differ in pairs. If n=7, for example, then the H matrix may be in the form $$H = \begin{pmatrix} 1 & 0 & 0 & 1 & 1 & 0 & 1 \\ 0 & 1 & 0 & 1 & 0 & 1 & 1 \\ 0 & 0 & 1 & 0 & 1 & 1 & 1 \end{pmatrix} = (I_3, P_{3,4}^T). \qquad (6)$$

The H matrix has 7 columns that all differ in pairs. The first three columns form a 3-dimensional unit matrix $I_3$. The next four columns form a (3,4) matrix $P_{3,4}^T$.

An associated G matrix G is $$G = \begin{pmatrix} 1 & 1 & 0 & 1 & 0 & 0 & 0 \\ 1 & 0 & 1 & 0 & 1 & 0 & 0 \\ 0 & 1 & 1 & 0 & 0 & 1 & 0 \\ 1 & 1 & 1 & 0 & 0 & 0 & 1 \end{pmatrix} = (P_{4,3}, I_4), \quad (7)$$

wherein the first three columns form the matrix $P_{4,3}$ and the next four columns form the four-dimensional unit matrix $I_4$. In this case, $P_{3,4}{}^T$ is the transposed matrix for the matrix $P_{4,3}$.

For the Hamming code under consideration, each of the seven 1-bit errors, i.e. including each of the seven error vectors [1,0,0,0,0,0,0], [0,1,0,0,0,0,0], [0,0,1,0,0,0,0], [0,0,0,1,0,0,0], [0,0,0,0,1,0,0], [0,0,0,0,0,1,0], [0,0,0,0,0,0,1], has an associated dedicated error syndrome $[1,0,0]^T$, $[0,1,0]^T$, $[0,0,1]^T$, $[1,1,0]^T$, $[1,0,1]^T$, $[0,1,1]^T$, $[1,1,1]^T$. A decoder then determines the bit that is to be corrected from the syndrome.

If the error syndrome is equal to $[1,0,0]^T$, for example, then $v'_1$ is to be corrected to $\bar{v}_1{}'=v_1{}'+1$. If the error syndrome is equal to $[1,1,1]^T$, then $v'_7$ is to be corrected to $\bar{v}_7=v_7{}'+1$.

If the code C is a Hsiao code, then all the columns of the H matrix differ in pairs, and each column of the H matrix has an uneven number of ones. If n=8, the H matrix for a Hsiao code may be in the form $$H = \begin{pmatrix} 1 & 0 & 0 & 0 & 1 & 1 & 1 & 0 \\ 0 & 1 & 0 & 0 & 1 & 1 & 0 & 1 \\ 0 & 0 & 1 & 0 & 1 & 0 & 1 & 1 \\ 0 & 0 & 0 & 1 & 0 & 1 & 1 & 1 \end{pmatrix} = (I_4, P_{4,4}^T), . \quad (8)$$

The first four columns form the 4-dimensional unit matrix $I_4$ and the next columns form the matrix $P_{4,4}{}^T$.

If a 2-bit error now occurs, it has a corresponding error vector with two ones. The associated error syndrome is obtained as a component-by-component (XOR) sum of two columns of the H matrix. Since each column has an uneven number of ones, the sum of two columns has an even number of ones, and the error syndrome for a 2-bit error can therefore be distinguished from all the error syndromes for a 1-bit error, since these have an uneven number of ones.

If C is a cross parity code, the data bits can notionally be arranged as a rectangular array. If the number k of data bits is a square number, e.g. $k=16=4^2$, then a 4×4 array comprising four rows and four columns can be formed, as illustrated in (9), $$\begin{matrix} u_1 & u_2 & u_3 & u_4 \\ u_5 & u_6 & u_7 & u_8 \\ u_9 & u_{10} & u_{11} & u_{12} \\ u_{13} & u_{14} & u_{15} & u_{16} \end{matrix} = \begin{matrix} u_{11} & u_{12} & u_{13} & u_{14} \\ u_{21} & u_{22} & u_{23} & u_{24} \\ u_{31} & u_{32} & u_{33} & u_{34} \\ u_{41} & u_{42} & u_{43} & u_{44} \end{matrix}. \quad (9)$$

In this case, however, it is not necessary for the data bits, in this case the bits $u_1, \ldots, u_{16}$, to be arranged in the specific manner illustrated in (9).

A further possible arrangement of the data bits as a 4×4 array, which is produced from the arrangement (9) by interchanging data bits, is illustrated in (10).

$$\begin{matrix} u_1 & u_{11} & u_{10} & u_6 \\ u_{16} & u_3 & u_2 & u_{12} \\ u_{13} & u_4 & u_9 & u_5 \\ u_7 & u_{15} & u_8 & u_{14} \end{matrix} = \begin{matrix} u_{11} & u_{12} & u_{13} & u_{14} \\ u_{21} & u_{22} & u_{23} & u_{24} \\ u_{31} & u_{32} & u_{33} & u_{34} \\ u_{41} & u_{42} & u_{43} & u_{44} \end{matrix}. \quad (10)$$

The arrangement (10) is obtained from the arrangement (9) by interchanging or permutating the indices of the data bits in accordance with the permutation π, where $$\pi = \begin{pmatrix} 1 & 2 & 3 & 4 & 5 & 6 & 7 & 8 & 9 & 10 & 11 & 12 & 13 & 14 & 15 & 16 \\ 1 & 11 & 10 & 6 & 16 & 3 & 2 & 12 & 13 & 4 & 9 & 5 & 7 & 15 & 8 & 14 \end{pmatrix}. \quad (11)$$

If 8 data bits $u_1, \ldots, u_8$ are existent, it is possible to form a 3×3 array, as shown in (12).

$$\begin{matrix} u_1 & u_2 & u_3 \\ u_4 & u_5 & u_6 \\ u_7 & u_8 & 0 \end{matrix} = \begin{matrix} u_1 & u_2 & u_3 \\ u_4 & u_5 & u_6 \\ u_7 & u_8 & \end{matrix} = \begin{matrix} u_{11} & u_{12} & u_{13} \\ u_{21} & u_{22} & u_{23} \\ u_{31} & u_{32} & \end{matrix}. \quad (12)$$

In this case, a constant value 0 can be added as element $u_9$, or it is also possible for a further element not to be added, in which case the relevant space in the array is simply not used.

In (12), the data bits $u_1, u_2, u_3$ form the first row, the data bits $u_4, u_5, u_6$ form the second row and the data bits $u_7, u_8, 0$ or $u_7, u_8$ form the third row of the array.

A further option for arranging the data bits $u_1, \ldots, u_8$ as a 3×3 array is shown in (13):

$$\begin{matrix} u_1 & u_2 & u_3 \\ & u_7 & u_8 \\ u_6 & u_5 & u_4 \end{matrix}. \quad (13)$$

In (13), the data bits $u_1, u_2, u_3$ form the first row, the data bits $u_7, u_8$ form the second row and the data bits $u_6, u_5, u_4$ form the third row. Accordingly, the first column comprises $u_1, u_6$, the second column comprises $u_2, u_7, u_5$ and the third column comprises $u_3, u_8, u_4$.

For 12 data bits $u_1, \ldots, u_{12}$, (14) shows a possible arrangement as a rectangular 4×3 array, $$\begin{matrix} u_1 & u_2 & u_3 \\ u_4 & u_5 & u_6 \\ u_7 & u_8 & u_9 \\ u_{10} & u_{11} & u_{12} \end{matrix} = \begin{matrix} u_{11} & u_{12} & u_{13} \\ u_{21} & u_{22} & u_{23} \\ u_{31} & u_{32} & u_{33} \\ u_{41} & u_{42} & u_{43} \end{matrix}. \quad (14)$$

When a cross parity code is applied, the check bits formed can be row parities and column parities.

For the array shown in (9), the row parities $p_1, p_2, p_3, p_4$ where $$p_1 = u_1 + u_2 + u_3 + u_4$$

$$p_2 = u_5 + u_6 + u_7 + u_8$$

$$p_3 = u_9 + u_{10} + u_{11} + u_{12}$$

$$p_4 = u_{13} + u_{14} + u_{15} + u_{16}$$

and the column parities $q_1, q_2, q_3, q_4$ where $$q_1 = u_1 + u_5 + u_9 + u_{13}$$

$$q_2 = u_2 + u_6 + u_{10} + u_{14}$$

$$q_3 = u_3 + u_7 + u_{11} + u_{15}$$

$$q_4 = u_4 + u_8 + u_{12} + u_{16}$$

may be formed.

In addition, the total parity $$P = u_1 + u_2 + \ldots + u_{16}$$

may be formed.

For the array shown in (10), the row parities $p_1, p_2, p_3, p_4$ are equal to $$p_1 = u_1 + u_{11} + u_{10} + u_6$$

$$p_2 = u_{16} + u_3 + u_2 + u_{12}$$

$$p_3 = u_{13} + u_4 + u_9 + u_5$$

$$p_4 = u_7 + u_{15} + u_8 + u_{14}$$

and the column parities $q_1, q_2, q_3, q_4$ are equal to $$q_1 = u_1 + u_{16} + u_{13} + u_7$$

$$q_2 = u_{11} + u_3 + u_4 + u_{15}$$

$$q_3 = u_{10} + u_2 + u_9 + u_8$$

$$q_4 = u_6 + u_{12} + u_5 + u_{14}.$$

The row parities and the column parities for the arrangement (10) are obtained from the row parities and column parities according to (9) by simply applying the permutation π.

The row parities $p_1, p_2, p_3, p_4$ can be regarded as a first group $G_1 = \{p_1, p_2, p_3, p_4\}$ of check bits and the column parities $q_1, q_2, q_3, q_4$ can be regarded as a second group $G_2 = \{q_1, q_2, q_3, q_4\}$ of check bits.

It is also possible to form further check bits or groups of check bits for cross parity codes, for example by forming what are known as diagonal parities, as described in the example embodiments and, by way of example, also in Rubinoff, M, "N-dimensional Codes for Detecting and Correcting Multiple Errors", Com. of the ACM, 1961, pp. 545-551.

The effect of the change in a data bit on the change in the check bits in the first group of check bits, i.e. in this case on the change in the row parities and on the change in a second group of check bits, i.e. in this case on the change in the column parities, will now be described. The aim in this case is to consider that a data bit $u_i$ has been disrupted into an erroneous data bit $\bar{u}_i$. As an example, the change in the data bit $u_6$ to $\bar{u}_6$ will be considered when the data bits are notionally arranged according to (9).

Since $p_2 = u_5 + u_6 + u_7 + u_8 \neq u_5 + \bar{u}_6 + u_7 + u_8 = \bar{p}_2$, $p_2$ changes to $\bar{p}_2$ when $u_6$ changes to $\bar{u}_6$. Since the row parities $p_1, p_3, p_4$ are not dependent on $u_6$, they also do not change when $u_6$ changes to an erroneous data bit $\bar{u}_6$.

Since $q_2 = u_2 + u_6 + u_{10} + u_{14} \neq u_2 + \bar{u}_6 + u_{10} + u_{14} = \bar{q}_2$, $q_2$ changes to $\bar{q}_2$ when $u_6$ changes to $\bar{u}_6$. Since the column parities $q_1, q_3, q_4$ are not dependent on $u_6$, they also do not change when $u_6$ changes to an erroneous data bit $\bar{u}_6$.

If the data bit $u_6$ changes to $\bar{u}_6$, precisely one bit, in this case the bit $p_2$, in the first group $G_1 = \{p_1, p_2, p_3, p_4\}$ and precisely one bit, in this case the bit $q_2$, in the second group $G_2 = \{q_1, q_2, q_3, q_4\}$ change. Totally analogously, it is possible to check for each data bit $u_1, \ldots, u_{16}$ that, when the data bit $u_i$ under consideration changes to $\bar{u}_i$, precisely one bit $p_{j_i}$ in the group $G_1$ and precisely one bit $q_{k_i}$ in the group $G_2$ change and that the pair $p_{j_i}, q_{k_i}$ is associated with the changing data bit $u_i$ for $i = 1, \ldots, 16$.

As a further example, the change in the data bit $u_6$ to $\bar{u}_6$ will be considered when the data bits are notionally arranged according to (10).

Since in this case $p_1 = u_1 + u_{11} + u_{10} + u_6 \neq u_1 + u_{11} + u_{10} + \bar{u}_6 = \bar{p}_1$, $p_1$ changes to $\bar{p}_1$ when $u_6$ changes to $\bar{u}_6$. Since $q_4 = u_6 + u_{12} + u_5 + u_{14} \neq \bar{u}_6 + u_{12} + u_5 + u_{14} = \bar{q}_4$, $q_4$ changes to $\bar{q}_4$ when $u_6$ changes to $\bar{u}_6$. Further row or column parities do not change.

If the data bit $u_6$ changes to $\bar{u}_6$, precisely one bit, in this case the bit $p_1$, in the first group $G_1 = \{p_1, p_2, p_3, p_4\}$ and precisely one bit, in this case the bit $q_4$, in the second group $G_2 = \{q_1, q_2, q_3, q_4\}$ change. Totally analogously, it is possible to check for each data bit $u_1, \ldots, u_{16}$ that, when the data bit $u_i$ under consideration changes to $\bar{u}_i$, precisely one bit $p_{j_i}$ in the group $G_1$ and precisely one bit $q_{k_i}$ in the group $G_2$ change and that the pair $p_{j_i}, q_{k_i}$ is associated with the changing data bit $u_i$ for $i = 1, \ldots, 16$.

For the two described arrangements according to (9) and (10), it is the case that, as for any cross parity code, there are two groups $G_1$ and $G_2$ of bits, which means that when precisely one data bit changes, precisely one bit from $G_1$ and precisely one bit from $G_2$ also change. The pair of changing bits from $G_1$ and $G_2$ also determines the changing data bit.

Hence, simple correction of an erroneously changed data bit is possible. The ANDing of the changes in each pair of bits, with the first bit from $G_1$ and with the second bit from $G_2$, is equal to the correction value for the associated data bit.

If $\Delta u_i$ denotes the correction signal for $u_i$, $\Delta p_j$ denotes the change in $p_j$ and $\Delta q_k$ denotes the change in $q_k$, the arrangement (9) has the changes $\Delta u_1 = \Delta p_1 \wedge \Delta q_1$, $\Delta u_2 = \Delta p_1 \wedge \Delta q_2, \ldots, \Delta u_{16} = \Delta p_4 \wedge \Delta q_4$.

For the arrangement (10), accordingly $\Delta u_1 = \Delta p_1 \wedge \Delta q_1$, $\Delta u_2 = \Delta p_2 \wedge \Delta q_3, \ldots, \Delta u_{16} = \Delta p_2 \wedge \Delta q_1$.

Figure 2:
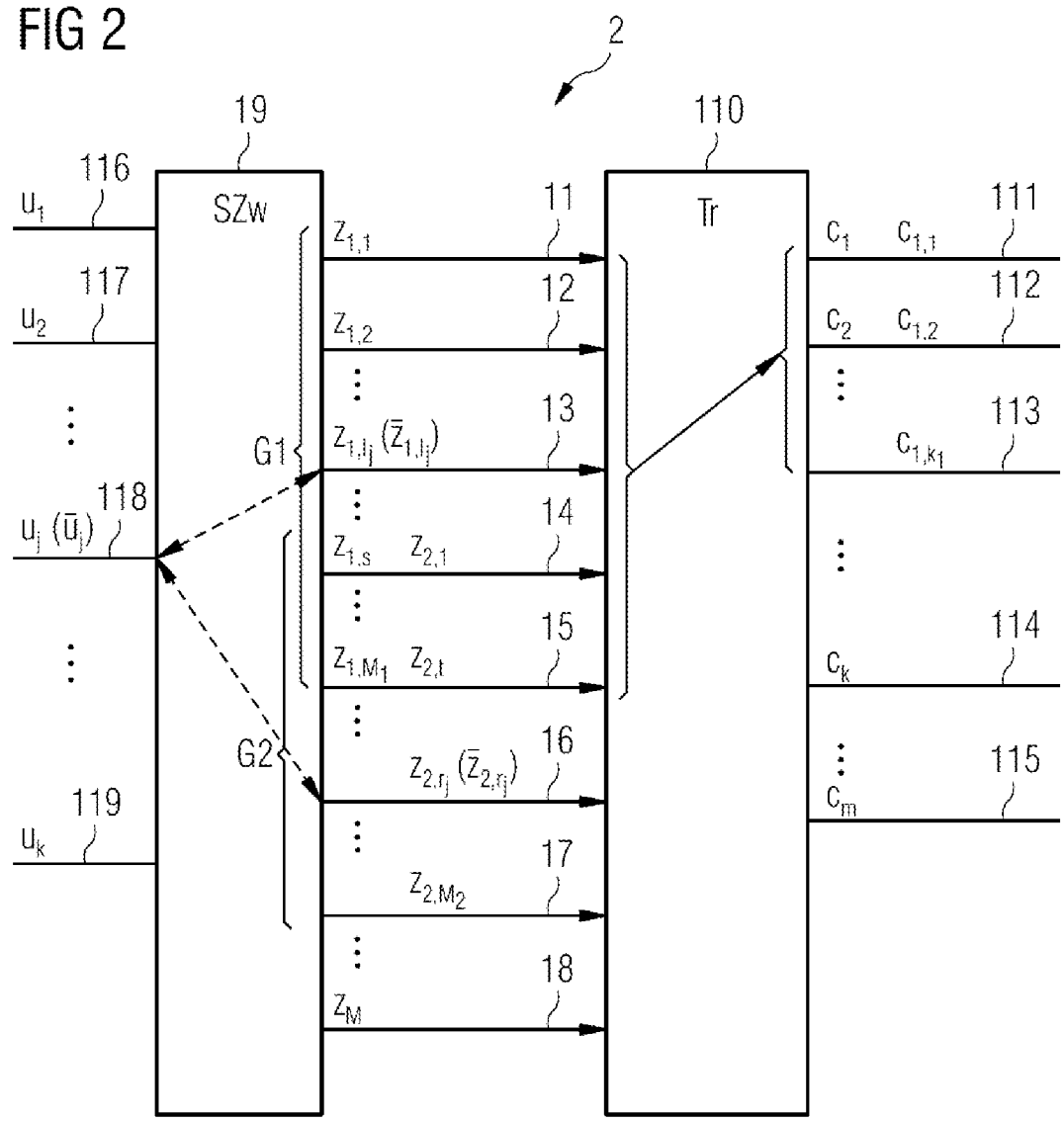
FIG. 2 shows a circuit arrangement for forming intermediate values and check bits according to an embodiment.

FIG. 2 shows a circuit arrangement 2 according to an embodiment. The circuit arrangement 2 determines m check bits $c_1, \ldots, c_m = c$ from k data bits $u_1, \ldots, u_k = u$. The circuit arrangement 2 consists of a first subcircuit SZw 19 for forming M binary intermediate values $z_1, \ldots, z_M$ having k binary inputs to which the data bits $u_1, \ldots, u_k$ are applied. The circuit SZw 19 has M binary outputs at which the intermediate values $z_1, \ldots, z_M$ are output and are connected to corresponding inputs on a second subcircuit Tr 110. The second subcircuit Tr 110 is called the transformation circuit. It transforms the intermediate values $z_1, \ldots, z_M$ into m check bits $c_1, \ldots, c_m$ and outputs them at their m outputs. In this case, m<M.

The intermediate values $z_1, \ldots, z_M$ that are output by the first subcircuit SZw 19 form a first group $G_1$ of $M_1$ intermediate values $z_{1,1}, z_{1,2}, \ldots, z_{i,j_i}, \ldots, z_{1,s}, \ldots, z_{1,M_1}$, which are output at the outputs 11, 12, 13, 14, 15, and a second group $G_2$ of $M_2$ intermediate values $z_{2,1} \ldots, z_{2,i}, \ldots, z_{2,r_i}, \ldots, z_{2,M_2}$, which are output at the outputs 14, 15, 16, 17. In this example embodiment, provision is made for the intermediate value that is output at the output 14 to belong both to group $G_1$ and to group $G_2$. As an element of group $G_1$, it is referred to as $z_{1,s}$ and as an element of group $G_2$, it is referred to as $z_{2,1}$, so that $z_{1,s} = z_{2,1}$.

Provision is also made in this example embodiment for the intermediate value that is output at the output 15 to belong both to group $G_1$ and to group $G_2$. As an element of group $G_1$, it is referred to as $z_{1,M_1}$, and as an element of group $G_2$, it is referred to as $z_{2,i}$, so that $z_{1,M_1} = z_{2,i}$.

The groups $G_1$ and $G_2$ of intermediate values have different intermediate values. Thus, the intermediate values $z_{1,1}, z_{1,2}, z_{1,l_j}$ that are output at the outputs 11, 12, 13 belong only to group $G_1$, while the intermediate values $z_{2,r_j}, z_{2,M_2}$ that are output at the outputs 16 and 17 belong only to group $G_2$. In other example embodiments, the groups $G_1$ and $G_2$ do not have any common elements. In the example embodiment in FIG. 2, the case in which there is at least one intermediate value that belongs neither to group $G_1$ nor to group $G_2$ is shown. Thus, the intermediate value $z_M$ that is output at the output 18 belongs neither to group $G_1$ nor to group $G_2$.

In other example embodiments, it is possible for each intermediate value to belong to a group of intermediate values.

The first subcircuit SZw 19 is configured such that each data bit $u_j$, j=1, ..., k, that is input to the first subcircuit SZw 19 has an associated pair of intermediate values $z_{1,l_j}, z_{2,r_j}$, with a first intermediate value $z_{1,l_j}$ belonging to group $G_1$ and the second intermediate values $z_{2,r_j}$ belonging to group $G_2$, with the following properties:

if $z_{1,l_j}(u_1, \ldots, u_{j-1}, u_j, u_{j+1}, \ldots, u_k)$ is the intermediate value $z_{1,l_j}$ determined from the data bits $(u_1, \ldots, u_{j-1}, u_j, u_{j+1}, \ldots, u_k)$, which belongs to the first group $G_1$, and if $z_{2,r_j}(u_1, \ldots, u_{j-1}, u_j, u_{j+1}, \ldots, u_k)$ is the intermediate value $z_{2,r_j}$, determined from the data bits $(u_1, \ldots, u_{j-1}, u_j, u_{j+1}, \ldots, u_k)$, which belongs to the second group $G_2$, then both $z_{1,l_j}$ changes to the negated value $\bar{z}_{j,l_j}$ and $z_{2,r_j}$ changes to the negated value $\bar{z}_{2,r_j}$ when the data bit $u_j$ changes to the negated data bit $\bar{u}_j$ and when no further data bit changes, so that $$z_{1,l_j}(u_1, \ldots, u_{j-1}, \bar{u}_j, u_{j+1}, \ldots, u_k) = \bar{z}_{1,l_j}(u_1, \ldots, u_{j-1}, u_j, u_{j+1}, \ldots, u_k)$$

$$z_{2,r_j}(u_1, \ldots, u_{j-1}, \bar{u}_j, u_{j+1}, \ldots, u_k) = \bar{z}_{2,r_j}(u_1, \ldots, u_{j-1}, u_j, u_{j+1}, \ldots, u_k).$$

Furthermore, also: if both $z_{1,l_j}$ changes to the negated value $\bar{z}_{j,l_j}$ and $z_{2,r_j}$ changes to the negated value $\bar{z}_{2,r_j}$ and if only one data bit is changed, then the data bit $u_j$ is changed.

In FIG. 2, the data bit $u_j$ is input at the input 118. The figure shows that the associated pair of intermediate values $z_{1,l_j}$ and $z_{2,r_j}$ is output at the outputs 13 and 16 of the first subcircuit SZw 19. If $u_j$ now changes to $\bar{u}_j$, then both $z_{1,l_j}$ changes to $\bar{z}_{1,l_j}$ and $z_{2,r_j}$ changes to $\bar{z}_{2,r_j}$. In FIG. 2, the changed values are each written in parentheses after the original values. The association between the data bit $u_j$ and the pair of intermediate values $z_{1,l_j}$ and $z_{2,r_j}$ and the association between the pair of intermediate values $z_{1,l_j}, z_{2,r_j}$ and the data bit $u_j$ are illustrated by two arrows.

As already described, each of the data bits $u_1, \ldots, u_k$ has an associated pair of corresponding intermediate values, as illustrated in FIG. 2 just for the input value $u_j$.

The second subcircuit Tr 110 transforms the intermediate values $z_1, \ldots, z_M$ into the check bits $c_1, \ldots, c_m$, which are output at the m binary outputs of the second subcircuit Tr.

In the example embodiment shown in FIG. 2, the intermediate values $z_{1,1}, \ldots, z_{1,M_1}$, which belong to group $G_1$, are transformed by the second subcircuit Tr 110 into the check bits $c_{1,1}, \ldots, c_{1,h_1}(z_{1,1}, \ldots, z_{1,k}, \ldots, z_{1,M_1})$, where $h_1 < M_1$ and where the check bits $c_{1,1}, c_{1,2}, \ldots, c_{1,h_1}$ are not dependent on further intermediate values.

The transformation circuit Tr 110 is configured such that the intermediate values $z_{1,1}(u_1, \ldots, u_i, \ldots, u_k), \ldots, z_{1,i}(u_1, \ldots, u_i, \ldots, u_k), \ldots, z_{1,M_1}(u_1, \ldots, u_i, \ldots u_k)$ determined by the data bits $u_1, \ldots, u_i, \ldots, u_k$ and the intermediate values $z_{1,1}(\bar{u}_1, \ldots, u_i, \ldots, u_k), \ldots, z_{1,i}(\bar{u}_1, \ldots, u_i, \ldots, u_k), \ldots,$ $z_{1,M_1}(\bar{u}_1, \ldots, u_i, \ldots u_k)$ $\vdots$ $z_{1,1}(u_1, \ldots, \bar{u}_i, \ldots, u_k), \ldots,$ $z_{1,i}(u_1, \ldots, \bar{u}_i, \ldots, u_k), \ldots, z_{1,M_1}(u_1, \ldots, \bar{u}_i, \ldots u_k)$ $\vdots$ $z_{1,1}(u_1, \ldots, u_i, \ldots, \bar{u}_k), \ldots, z_{1,i}(u_1, \ldots, u_i, \ldots, \bar{u}_k), \ldots,$ $z_{1,M_1}(u_1, \ldots, u_i, \ldots \bar{u}_k)$ determined by the data bits inverted in a respective bit are transformed into sequences of m check bits that differ in pairs.

In particular embodiments, it is possible for the check bits $c_{h_1+1}, \ldots, c_m$ to be equal to the intermediate values $z_{M-(m-h_1-1)}, \ldots, z_M$.

FIG. 3a shows a further example embodiment of the circuit arrangement 3 according to an embodiment. The circuit arrangement 3 comprises a first subcircuit SZw 29 for forming M binary intermediate values $z_1, \ldots, z_M$ having k binary inputs to which the data bits $u_1, \ldots, u_k$ are applied. The circuit SZw 29 has M binary outputs at which the intermediate values $z_1, \ldots, z_M$ are output and that are connected to the corresponding inputs of a transformation circuit Tr 210. It transforms the intermediate values $z_1, \ldots, z_M$ into m check bits $c_1, \ldots, c_m$ and outputs them at its m outputs. In this case, m<M.

The intermediate values $z_1, \ldots, z_M$ that are output by the first subcircuit SZw 29 form a first group $G_1$ of $M_1$ intermediate values $z_{1,1}, z_{1,2}, \ldots, z_{1,l_j}, \ldots, z_{1,s}, \ldots, z_{1,M_1}$, which are output at the outputs 21, 22, 23, 24, 25, and a second group $G_2$ of $M_2$ intermediate values $z_{2,1}, \ldots, z_{2,t}, \ldots, z_{2,r_j}, \ldots, z_{2,M_2}$, which are output at the outputs 24, 25, 26, 27. In this example embodiment, provision is made for the intermediate value that is output at the output 24 to belong both to the group $G_1$ and to the group $G_2$. As an element of group $G_1$, it is referred to as $z_{1,s}$, and as an element of group $G_2$, it is referred to as $z_{2,1}$, so that $z_{1,s} = z_{2,1}$.

This example embodiment also has provision for the intermediate value that is output at the output 25 to belong both to group $G_1$ and to group $G_2$. As an element of group $G_1$, it is referred to as $z_{1,M_1}$, and as an element of group $G_2$, it is referred to as $z_{2,t}$, so that $z_{1,M_1} = z_{2,t}$.

The groups $G_1$ and $G_2$ of intermediate values have different intermediate values. Thus, the intermediate values $z_{1,1}, z_{1,2}, z_{1,l_j}$ that are output at the outputs 21, 22, 23 belong only to group $G_1$, while the intermediate values $z_{2,r_j}, z_{2,M_2}$ that are output at the outputs 26 and 27 belong only to group $G_2$.

In the example embodiment in FIG. 3a, the case in which there is at least one intermediate value that belongs neither to group $G_1$ nor to group $G_2$ is shown. Thus, the intermediate value $z_M$ that is output at the output 28 belongs neither to group $G_1$ nor to group $G_2$.

In other example embodiments, it is possible for each intermediate value to belong to a group of intermediate values.

The first subcircuit SZw 29 is configured such that each data bit $u_j$, j=1, ..., k, that is input into the first subcircuit SZw 29 has an associated pair of intermediate values $z_{1,l_j}, z_{2,r_j}$, with a first intermediate value $z_{1,l_j}$ belonging to the group $G_1$ and with the second intermediate value $z_{2,r_j}$ belonging to the group $G_2$, with the properties already described in the example embodiment from FIG. 2.

In FIG. 3a, the data bit $u_j$ is input at the input 218. The figure shows that the associated pair of intermediate values $z_{1,l_j}$ and $z_{2,r_j}$ is output at the outputs 23 and 26 of the first subcircuit SZw 29. If $u_j$ now changes to $\bar{u}_j$, then $z_{1,l_j}$ changes to $\bar{z}_{1,l_j}$ and $z_{2,r_j}$ changes to $\bar{z}_{2,r_j}$. In FIG. 3a, as in FIG. 2, the changed values are each written in parentheses after the original values. The association between the data bit $u_j$ and the pair of intermediate values $z_{1,l_j}$ and $z_{2,r_j}$ and the association between the pair of intermediate values $z_{1,l_j}, z_{2,r_j}$ and the data bit $u_j$ are illustrated by two arrows.

As already described, each of the data bits $u_1, \ldots, u_k$ has an associated pair of corresponding intermediate values, as illustrated in FIG. 3a just for the input value $u_j$.

The second subcircuit Tr 210 transforms the intermediate values $z_1, \ldots, z_M$ into the check bits $c_1, \ldots, c_m$, which are output at the m binary outputs of the second subcircuit Tr.

In the example embodiment shown in FIG. 3a, the intermediate values $z_{1,1}, \ldots, z_{1,M_1}$, that belong to group $G_1$ are transformed by the second subcircuit Tr 210 into the check bits $c_{1,1}, \ldots, c_{1,h_1}(z_{1,1}, \ldots, z_{1,k}, \ldots, z_{1,M_1})$, where $h_1 < M_1$ and where the check bits $c_{1,1}, c_{1,2}, \ldots, c_{1,h_1}$ are not dependent on further intermediate values. The intermediate values $z_{2,1}, \ldots, z_{2,M_2}$ that belong to group $G_2$ are transformed by the second subcircuit Tr 210 into the check bits $c_{2,1}, \ldots, c_{2,h_2}(z_{2,1}, \ldots z_{2,k}, \ldots, z_{2,M_2})$, where $h_2 < M_2$ and where the check bits $c_{2,1}, c_{2,2}, \ldots, c_{2,h_2}$ are not dependent on further intermediate values.

The transformation circuit Tr 210 is configured such that for q=1,2 the intermediate values $$z_{q,1}(u_1, \ldots, u_i, \ldots, u_k), \ldots, z_{q,i}(u_1, \ldots, u_i, \ldots, u_k), \ldots, z_{q,M_1}(u_1, \ldots, u_i, \ldots, u_k)$$

determined by the data bits $u_1, \ldots, u_i, \ldots, u_k$ and the intermediate values $$z_{q,1}(\bar{u}_1, \ldots, u_i, \ldots, u_k), \ldots, z_{q,i}(\bar{u}_1, \ldots, u_i, \ldots, u_k), \ldots,$$
$$z_{q,M_q}(\bar{u}_1, \ldots, u_i, \ldots, u_k)$$
$$\vdots$$
$$z_{q,1}(u_1, \ldots, \bar{u}_i, \ldots, u_k), \ldots, z_{q,i}(u_1, \ldots, \bar{u}_i, \ldots, u_k), \ldots,$$
$$z_{q,M_q}(u_1, \ldots, \bar{u}_i, \ldots, u_k)$$
$$\vdots$$
$$z_{q,1}(u_1, \ldots, u_i, \ldots, \bar{u}_k), \ldots, z_{q,i}(u_1, \ldots, u_i, \ldots, \bar{u}_k), \ldots,$$
$$z_{q,M_q}(u_1, \ldots, u_i, \ldots, \bar{u}_k)$$

determined by the data bits inverted in a respective bit are transformed into sequences of m check bits that differ in pairs.

Figure 3B:
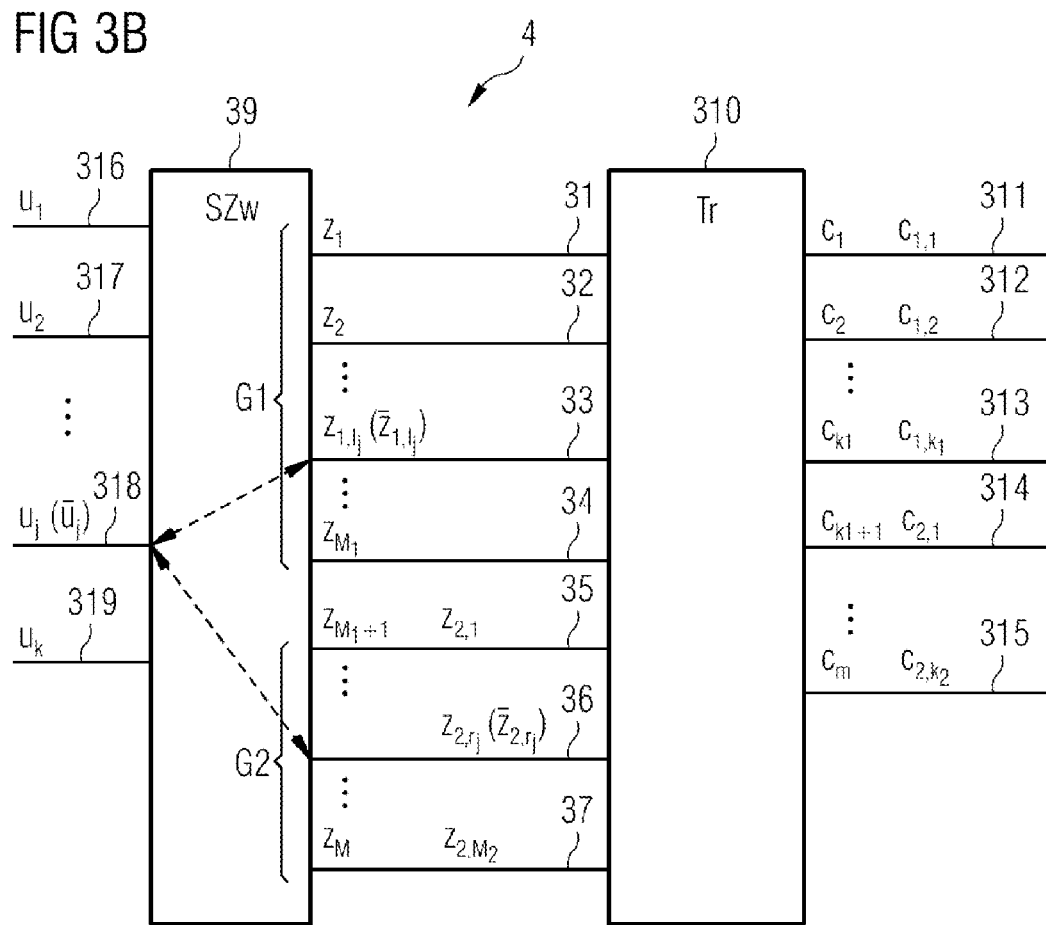
FIG. 3B shows a circuit arrangement with disjoint groups of intermediate values according to an embodiment.

FIG. 3b shows a further example embodiment of a circuit arrangement 4 according to an embodiment. The circuit arrangement 4 comprises a first subcircuit SZw 39 for forming M binary intermediate values $z_1, \ldots, z_M$ having k binary inputs 316 to 319 to which the data bits $u_1, \ldots, u_k$ are applied. The circuit SZw 39 has M binary outputs 31 to 37 at which the intermediate values $z_1, \ldots, z_M$ are output and that are connected to corresponding inputs of a transformation circuit Tr 310. The transformation circuit Tr 310 transforms the intermediate values $z_1, \ldots, z_M$ into m check bits $c_1, \ldots, c_m$ and outputs them at its m outputs. In this case, m<M.

The intermediate values $z_1, \ldots, z_M$ that are output by the first subcircuit SZw 39 form a first group $G_1$ of $M_1$ intermediate values $z_{1,1}, \ldots, z_{1,l_j}, \ldots, z_{1,M_1} = z_1, z_2, \ldots, z_{1,l_j} \ldots z_{M_1}$, which are output at the outputs 31, 32, 33, 34, and a second group $G_2$ of $M_2$ intermediate values $z_{2,1}, \ldots, z_{2,r_j}, \ldots, z_{2,M_2} = z_{M_1+1}, \ldots, z_{2,r_j}, \ldots z_M$, which are output at the outputs 35, 36, 37. In this example embodiment, provision is made for each intermediate value to belong either to group $G_1$ or to group $G_2$.

In the example embodiment under consideration, the groups $G_1$ and $G_2$ of intermediate values do not have any common intermediate values, and each intermediate value belongs either to group $G_1$ or to group $G_2$.

The first subcircuit SZw 39 is configured such that each data bit $u_j$, j=1, ..., k, that is input into the first subcircuit SZw 39 has an associated pair of intermediate values $z_{1,l_j}, z_{2,r_j}$ with a first intermediate value $z_{1,l_j}$ belonging to group $G_1$ and with the second intermediate value $z_{2,r_j}$ belonging to group $G_2$, with the properties already described in the example embodiment from FIG. 2.

In FIG. 3b, the data bit $u_j$ is input at the input 318. The figure shows that the associated pair of intermediate values $z_{1,l_j}$ and $z_{2,r_j}$ is output at the outputs 33 and 36 of the first subcircuit SZw 39. If $u_j$ now changes to $\bar{u}_j$, then both $z_{1,l_j}$ changes to $\bar{z}_{1,l_j}$ and $z_{2,r_j}$ changes to $\bar{z}_{2,r_j}$. In FIG. 3b, as in FIG. 2 and FIG. 3a, the changed values are each written in parentheses after the original values. The association between the data bit $u_j$ and the pair of intermediate values $z_{1,l_j}$ and $z_{2,r_j}$ and the association between the pair of intermediate values $z_{1,l_j}, z_{2,r_j}$ and the data bit $u_j$ are illustrated by two arrows.

As already described, each of the data bits $u_1, \ldots, u_k$ has an associated pair of corresponding intermediate values, as illustrated in FIG. 3b just for the input value $u_j$.

The second subcircuit Tr 310 transforms the intermediate values $z_1, \ldots, z_M$ into the check bits $c_1, \ldots, c_m$, which are output at the in binary outputs 311 to 315 of the second subcircuit Tr 310.

In the example embodiment shown in FIG. 3b, the intermediate values $z_{1,1}, \ldots, z_{1,M_1} = z_1, \ldots, z_{M_1}$ that belong to group $G_1$ are transformed by the second subcircuit 310 into the check bits $c_{1,1}, \ldots, c_{1,h_1} = c_1, \ldots, c_{h_1}(z_1, \ldots, z_{M_1})$, which are output at the outputs 311 to 313, where $h_1 < M_1$.

The intermediate values $z_{2,1}, \ldots, z_{2,M_2} = z_{M_1+1}, \ldots, z_M$ that belong to group $G_2$ are transformed by the second subcircuit Tr 310 into the check bits $c_{h_1+1}, \ldots, c_m$, which are output at the outputs 314 to 315, where $h_2 < M_2$.

An example embodiment with 16 data bits $u_1, u_1, \ldots, u_{16}$ is explained below.

Figure 4:
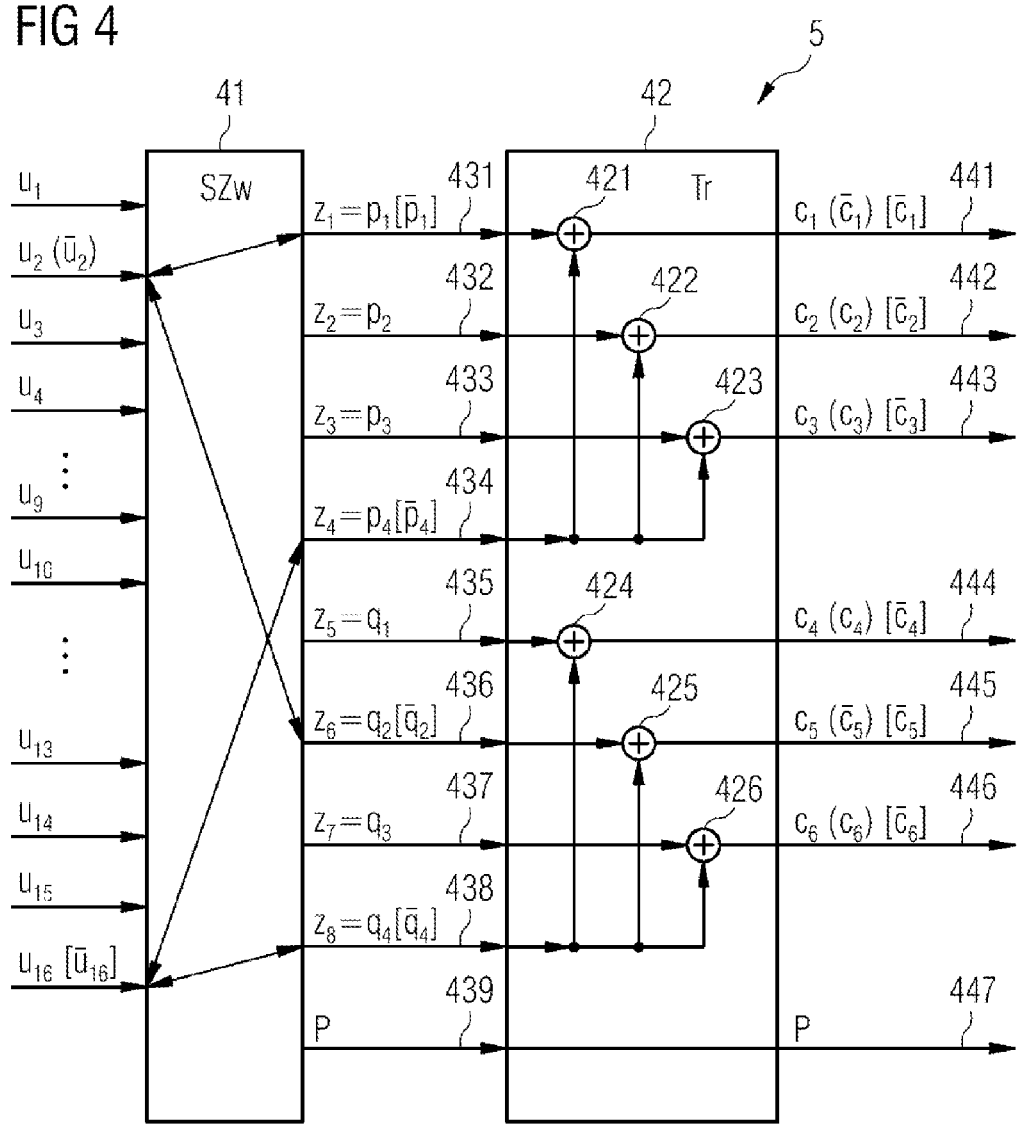
FIG. 4 shows a circuit arrangement with 16 useful data bits and 7 check bits according to an embodiment.

FIG. 4 shows a circuit arrangement 5 according to an embodiment with 16 data bits $u_1, \ldots, u_{16}$.

The first subcircuit SZw 41 has 16 binary inputs, at which the data bits $u_1, \ldots, u_{16}$ are input, and 8 binary outputs 431-438, at which the binary intermediate values $z_1, \ldots, z_8$ are output, and a further binary output 439, at which a total parity bit P is output.

The 8 intermediate values $z_1 = p_1$, $z_2 = p_2$, $z_3 = p_3$, $z_4 = p_4$, $z_5 = q_1$, $z_6 = q_2$, $z_6 = q_3$, $z_8 = q_4$ are determined by the first subcircuit SZw from the data bits according to the relationships $$z_1 = p_1 = u_1 \oplus u_2 \oplus u_3 \oplus u_4 \quad (15)$$

$$z_2 = p_2 = u_5 \oplus u_6 \oplus u_7 \oplus u_8 \quad (16)$$

$$z_3 = p_3 = u_9 \oplus u_{10} \oplus u_{11} \oplus u_{12} \quad (17)$$

$$z_4 = p_4 = u_{13} \oplus u_{14} \oplus u_{15} \oplus u_{16} \quad (18)$$

and $$z_5 = q_1 = u_1 \oplus u_5 \oplus u_9 \oplus u_{13} \tag{19}$$

$$z_6 = q_2 = u_2 \oplus u_6 \oplus u_{10} \oplus u_{14} \tag{20}$$

$$z_7 = q_3 = u_3 \oplus u_7 \oplus u_{11} \oplus u_{15} \tag{21}$$

$$z_8 = q_4 = u_4 \oplus u_8 \oplus u_{12} \oplus u_{16} \tag{22}$$

The intermediate values $p_1, \ldots, p_4$ correspond to the row parities and the intermediate values $q_1, \ldots, q_4$ correspond to the column parities of a cross parity code with 16 data bits.

The group $G_1$ comprises the intermediate values $p_1, p_2, p_3, p_4$ and the group $G_2$ comprises the intermediate values $q_1, q_2, q_3, q_4$.

If the value of a data bit $u_i$ changes to the negated value $\bar{u}_i$ while all the remaining data bits remain unchanged, precisely one pair $p_{j_{1,i}}$, $q_{j_{2,i}}$ of intermediate values changes, one intermediate value, in this case the intermediate value $p_{j_{1,i}}$, being from $G_1$ and one intermediate value, in this case the intermediate value $q_{j_{2,i}}$, being from $G_2$. By way of example, the intermediate value $p_1 \in G_1$ changes to $\bar{p}_1$ and the intermediate value $q_2 \in G_2$ changes to $\bar{q}_2$ when $u_2$ changes to $\bar{u}_2$ and when no further data bit changes.

The second input is marked $u_2$ and $(\bar{u}_2)$. This input is connected both to the output 431 and to the output 436 of the first subcircuit SZw 41 by means of a double-headed arrow, these outputs being marked $(\bar{p}_1)$ and $(\bar{q}_2)$ in order to illustrate that a change from $u_2$ to $\bar{u}_2$ results in a change from $p_1$ to $\bar{p}_1$ and from $q_2$ to $\bar{q}_2$.

A change in the value $u_{16}$ to $\bar{u}_{16}$ results in a change in the intermediate value $p_4$ to $\bar{p}_4$ and in the intermediate value $q_4$ to $\bar{q}_4$. The sixteenth input, which is marked $u_{16}$ and $[\bar{u}_{16}]$, is connected to the output 434, which is marked $p_4$ and $[\bar{p}_4]$, and to the output 438, which is marked $q_4$ and $[\bar{q}_4]$, by means of a respective double-headed arrow. It is illustrated that a change from $u_{16}$ to $\bar{u}_{16}$ results in a change from $p_4$ to $\bar{p}_4$ and from $q_4$ to $\bar{q}_4$.

Furthermore, the double-headed arrows illustrate that the result of a change from $p_1$ to $\bar{p}_1$ and $q_2$ to $\bar{q}_2$ is that $u_2$ has changed to $\bar{u}_2$ when only a single data bit changes.

Similarly, the double-headed arrows illustrate that the result of a change from $p_4$ to $\bar{p}_4$ and $q_4$ to $\bar{q}_4$ is that $u_{16}$ has changed to $\bar{u}_{16}$ when no further data bit has changed.

The first subcircuit SZw 41 has a further output 439 that carries the parity $P = u_1 \oplus u_2 \oplus \ldots \oplus u_{16}$. An output that carries the parity of the input signals may be expedient in instances of application.

In the example embodiment described, the intermediate values $p_1, p_2, p_3, p_4$ in group $G_1$ are transformed by the second subcircuit Tr 42 into the check bits $c_1, c_2, c_3$ according to the relationship $$(c_1, c_2, c_3) = A_1 \cdot (p_1, p_2, p_3, p_4) \tag{23}$$

and the intermediate values $q_1, q_2, q_3, q_4$ in group $G_2$ are transformed by the second subcircuit Tr 42 into the check bits $c_4, c_5, c_6$ according to the relationship $$(c_4, c_5, c_6) = A_2 \cdot (q_1, q_2, q_3, q_4) \tag{24}$$

where $$A_1 = A_2 = \begin{pmatrix} 1 & 0 & 0 & 1 \\ 0 & 1 & 0 & 1 \\ 0 & 0 & 1 & 1 \end{pmatrix}. \tag{25}$$

If the data bit $u_2$, for example, erroneously changes to $\bar{u}_2$, while all the other data bits do not change, then according to equation (15) the intermediate value $p_1$ changes to $\bar{p}_1$ and according to equation (20) the intermediate value $q_2$ changes to $\bar{q}_2$. In this case, $p_1$ belongs to group $G_1$, while $q_2$ belongs to group $G_2$.

According to equations (23), (24) and (25), the check bits $c_1, c_2, c_3$ then change to $(\bar{c}_1, c_2, c_3)$ and the check bits $c_4, c_5, c_6$ change to $(c_4, \bar{c}_5, c_6)$.

If the data bit $u_{16}$, for example, erroneously changes to $\bar{u}_{16}$, then according to equation (18) the intermediate value $p_4$ changes to $\bar{p}_4$ and according to equation (22) the intermediate value $q_4$ changes to $\bar{q}_4$. The intermediate value $p_4$ belongs to group $G_1$ and the intermediate value $q_4$ belongs to group $G_2$.

According to equations (23), (24) and (25), the check bits $c_1, c_2, c_3$ then change to $(\bar{c}_1, \bar{c}_2, \bar{c}_3)$ and the check bits $c_4, c_5, c_6$ change to $(\bar{c}_4, \bar{c}_5, \bar{c}_6)$.

If all possible changes of data bits $u_i$ to $\bar{u}_i$ are considered in the same way for $i \in \{1, \ldots, 16\}$, the changes in the check bits $c_1, \ldots, c_6$ that are associated with these changes in the intermediate values all differ in pairs.

It can be seen that the 8 check bits $p_1, p_2, p_3, p_4, q_1, q_2, q_3$ and $q_4$ from a cross parity code with 16 data bits $u_1, \ldots, u_{16}$ as intermediate values are, according to an embodiment, transformed into 6 check bits $c_1, \ldots, c_6$, which means that the number of check bits decreases.

According to the relationships specified in (23) and (24), the following equations are obtained for the check bits $$c_1 = p_1 \oplus p_4, \tag{26}$$

$$c_2 = p_2 \oplus p_4, \tag{27}$$

$$c_3 = p_3 \oplus p_4, \tag{28}$$

$$c_4 = q_1 \oplus q_4, \tag{29}$$

$$c_5 = q_2 \oplus q_4, \tag{30}$$

$$c_6 = q_3 \oplus q_4. \tag{31}$$

The relationships 26 to 31 are provided by the second subcircuit Tr 42 from FIG. 4.

The 9 inputs of the second subcircuit Tr 42 are connected to the corresponding outputs 431 to 439 of the first subcircuit SZw 41. The inputs of the first subcircuit Tr 42 are denoted by the same numbers as the outputs of the first subcircuit SZw 41.

In order to form the parity bits at its outputs 441-446, the second subcircuit Tr 42 logically combines appropriate inputs using XOR gates.

According to equation (26), the input 431 that carries the intermediate value $z_1 = p_1$ and the input 434 that carries the intermediate value $z_4 = p_4$ are routed to a first input and to a second input of an XOR gate 421, the output 441 of which outputs the value of the check bit according to equation (26).

According to equation (30), the input 436 that carries the intermediate values $z_6 = q_2$ is connected to a first input of an XOR gate 425, the second input of which is connected to the input 438 that carries the value $z_8 = q_4$, and the output 445 of which outputs the value $c_5$. If the word contains P which is output to the output 439 of the first subcircuit SZw 41, then P is output to the output 447 by the second subcircuit Tr 42 without alteration.

The data bits $u = u_1, \ldots, u_{16}$ and the check bits $c = c_1, \ldots, c_6$ can be stored in a memory at the address a. If the data bits $u' = u_1', \ldots, u_{16}'$ and the check bits $c' = c_1', \ldots, c_6'$ are read from the memory at the address a after some time, u and u' and c and c' may differ on account of errors that arise as a result of radiation, for example.

For the purpose of error correction, in this case for the purpose of error correction for 1-bit errors, changes $\Delta c_i$, i= 1, . . . , 6 in the check bits may be determined as follows.

The effect of a 1-bit error in the data bits is that precisely one of the intermediate values $p_i \epsilon \{p_1,p_2,p_3,p_4\}=G_1$ and one of the intermediate values $q_j \epsilon \{q_1,q_2,q_3,q_4\}=G_2$ change.

According to relationships (26) to (28), a change $\Delta p_1=1$ in the intermediate value $p_1$ to $\overline{p_1}$ corresponds to a change $\Delta c_1=1$, $\Delta c_2=0$, $\Delta c_3=0$ in the check bits $c_1$, $c_2$, $c_3$ to $c_1'$, $c_2'$, $c_3'$, where $c_1'=\overline{c_1}$, $c_2'=c_2$ and $c_3'=c_3$, so that only $c_1$ changes to $\overline{c_1}$. To illustrate this change, the value $(\overline{p_1})$ is shown at the input 431 after $z_1=p_1$. Accordingly, the values $(\overline{c_1})$, $(c_2)$, $(c_3)$ are shown next to the values $c_1$, $c_2$, $c_3$ at the outputs 441, 442, 443.

According to relationships (26) to (28), a change $\Delta p_4=1$ in the intermediate value $p_4$ to $\overline{p_4}$ corresponds, by contrast, to a change $\Delta c_1=1$, $\Delta c_2=1$, $\Delta c_3=1$ in the check bits $c_1$, $c_2$, $c_3$ to $c_1'$, $c_2'$, $c_3'$, where $c_1'=\overline{c_1}$, $c_2'=\overline{c_2}$ and $c_3'=\overline{c_3}$.

A change $\Delta p_2=1$ in the intermediate value $p_2$ to $\overline{p_2}$ corresponds to a change $\Delta c_1=0$, $\Delta c_2=1$, $\Delta c_3=0$ in the check bits $c_1$, $c_2$, $c_3$ to $c_1'$, $c_2'$, $c_3'$, where $c_1'=c_1$, $c_2'=\overline{c_2}$ and $c_3'=c_3$.

A change $\Delta p_3=1$ in the intermediate value $p_3$ to $\overline{p_3}$ corresponds to a change $\Delta c_1=0$, $\Delta c_2=0$, $\Delta c_3=1$ in the check bits $c_1$, $c_2$, $c_3$ to $c_1'$, $c_2'$, $c_3'$, where $c_1'=c_1$, $c_2'=c_2$ and $c_3'=\overline{c_3}$.

Correspondingly, according to relationships (29) to (31): a change $\Delta q_1=1$ in the intermediate value $q_1$ to $\overline{q_1}$, corresponds to a change $\Delta c_4=1$, $\Delta c_5=0$, $\Delta c_6=0$ in the check bits $c_4$, $c_5$, $c_6$ to $c_4'$, $c_5'$, $c_6'$, where $c_4'=\overline{c_4}$, $c_5'=c_5$ and $c_6'=c_6$. A change $\Delta q_2=1$ in the intermediate value $q_2$ to $\overline{q_2}$ corresponds to a change $\Delta c_4=0$, $\Delta c_5=1$, $\Delta c_6=0$ in the check bits $c_4$, $c_5$, $c_6$ to $c_4'$, $c_5'$, $c_6'$, where $c_4'=c_4$, $c_5'=\overline{c_5}$ and $c_6'=c_6$. A change $\Delta q_3=1$ in the intermediate value $q_3$ to $\overline{q_3}$ corresponds to a change $\Delta c_4=0$, $\Delta c_5=0$, $\Delta c_6=1$ in the check bits $c_4$, $c_5$, $c_6$ to $c_4'$, $c_5'$, $c_6'$, where $c_4'=c_4$, and $c_6'=\overline{c_6}$. A change $\Delta q_4=1$ in the intermediate value $q_4$ to $\overline{q_4}$ corresponds to a change $\Delta c_4=1$, $\Delta c_5=1$, $\Delta c_6=1$ in the check bits $c_4$, $c_5$, $c_6$ to $c_4'$, $c_5'$, $c_6'$, where $c_4'=\overline{c_4}$, $c_5'=\overline{c_5}$ and $c_6'=\overline{c_6}$.

Table 1 summarizes these statements for $\Delta c_1$, $\Delta c_2$, $\Delta c_3$ and $\Delta p_1$, $\Delta p_2$, $\Delta p_3$, $\Delta p_4$.

TABLE 1

| $\Delta c_1$ | $\Delta c_2$ | $\Delta c_3$ | $\Delta p_1$ | $\Delta p_2$ | $\Delta p_3$ | $\Delta p_4$ |
|---|---|---|---|---|---|---|
| 0 | 0 | 0 | 0 | 0 | 0 | 0 |
| 1 | 0 | 0 | 1 | 0 | 0 | 0 |
| 0 | 1 | 0 | 0 | 1 | 0 | 0 |
| 0 | 0 | 1 | 0 | 0 | 1 | 0 |
| 1 | 1 | 1 | 0 | 0 | 0 | 1 |

A change in one of the intermediate values $p_1$, $p_2$, $p_3$, $p_4$ has an associated change in the check bits $c_1$, $c_2$, $c_3$, as shown in table 1.

The appropriate correlations for $\Delta c_4$, $\Delta c_5$, $\Delta c_6$ and $\Delta q_1$, $\Delta q_2$, $\Delta q_3$, $\Delta q_4$ are shown in table 2.

TABLE 2

| $\Delta c_4$ | $\Delta c_5$ | $\Delta c_6$ | $\Delta q_1$ | $\Delta q_2$ | $\Delta q_3$ | $\Delta q_4$ |
|---|---|---|---|---|---|---|
| 0 | 0 | 0 | 0 | 0 | 0 | 0 |
| 1 | 0 | 0 | 1 | 0 | 0 | 0 |
| 0 | 1 | 0 | 0 | 1 | 0 | 0 |
| 0 | 0 | 1 | 0 | 0 | 1 | 0 |
| 1 | 1 | 1 | 0 | 0 | 0 | 1 |

A change in the intermediate values $q_1$, $q_2$, $q_3$, $q_4$ has an associated change in the check bits $c_4$, $c_5$, $c_6$ as shown in table 2.

The changes in the check bits can be used to determine the changes in the intermediate values by means of the relationships $$\Delta p_1 = \Delta c_1 \wedge \neg(\Delta c_2 \vee \Delta c_3), \tag{32}$$

$$\Delta p_2 = \Delta c_2 \wedge \neg(\Delta c_1 \vee \Delta c_3), \tag{33}$$

$$\Delta p_3 = \Delta c_3 \wedge \neg(\Delta c_1 \vee \Delta c_2), \tag{34}$$

$$\Delta p_4 = \Delta c_1 \wedge \neg \Delta c_2 \vee \Delta c_3, \tag{35}$$

and $$\Delta q_1 = \Delta c_4 \wedge \neg(\Delta c_5 \vee \Delta c_6), \tag{36}$$

$$\Delta q_2 = \Delta c_5 \wedge \neg(\Delta c_4 \vee \Delta c_6), \tag{37}$$

$$\Delta q_3 = \Delta c_6 \wedge \neg(\Delta c_4 \vee \Delta c_5), \tag{38}$$

$$\Delta q_4 = \Delta c_4 \wedge \Delta c_5 \wedge \Delta c_6 \tag{39}$$

The changes in the intermediate values can now be used to locate and correct any 1-bit errors in the data bits. If $\Delta p_2$ and $\Delta q_4$ are equal to one, for example, then there is an error in the $2^{nd}$ row and $4^{th}$ column, and hence in $u_8$.

The correction equation for the read data bit $u_8'$ comprises ANDing of $\Delta p_2$ and $\Delta q_4$ $$u_8 = u_8' \oplus (\Delta p_2 \wedge \Delta q_4).$$

In a similar manner to $u_8$, the correction equations for the remaining data bits are determined.

A data bit is corrected when an intermediate value from the first group $G_1=\{p_1,p_2,p_3,p_4\}$ and an intermediate value from the second group $G_2=\{q_1,q_2,q_3,q_4\}$ has changed.

ANDing of all the pairs of intermediate value changes, wherein a first intermediate value is from $G_1$ and a second intermediate value is from $G_2$ and the subsequent XORing of the output of the AND function with the appropriate data bit do not cause any difficulties for a person skilled in the art.

Figure 5:
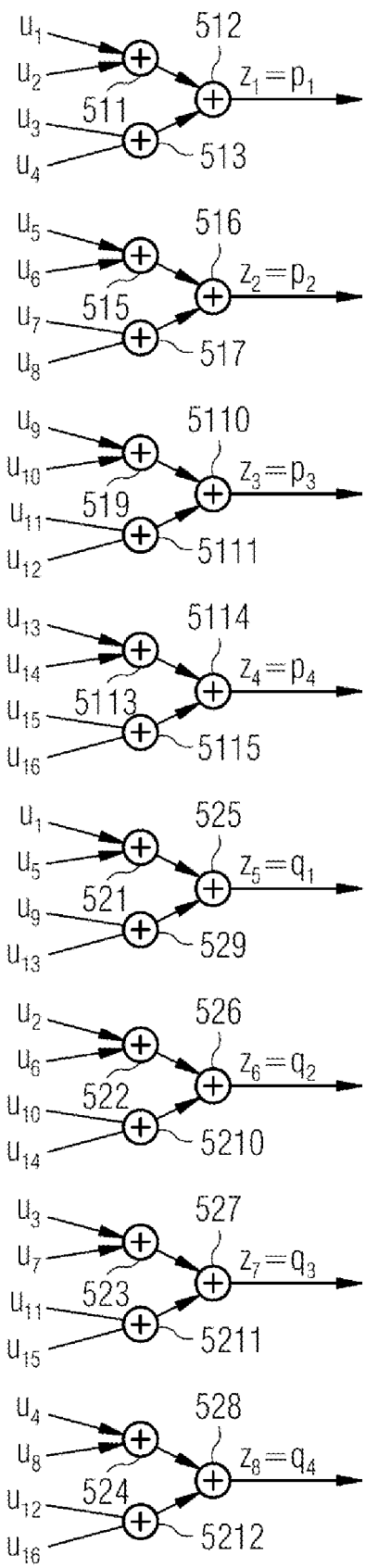
FIG. 5 shows an implementation of the first subcircuit SZw for forming intermediate values with 16 useful data bits, according to an embodiment.

FIG. 5 shows a possible implementation of the first subcircuit SZw 41 from FIG. 4. In order to form the intermediate values $z_1=p_1, \ldots, z_8=q_4$, appropriate data bits are XORed.

For i=1, 3, 5, 7, 9, 11, 13, 15, the input of the circuit SZw 41 that carries the signal $u_i$ is connected to a first input of an XOR gate 51i, the second input of which is connected to the circuit input that carries the signal $u_{i+1}$.

The output of the XOR gate 51j is connected to a first input of an XOR gate 51(j+1), the second input of which is connected to the output of the XOR gate 51j+2, where j∈{1,5,9,13}.

The output of the XOR gate 512 carries the intermediate value $z_1=p_1$.

The output of the XOR gate 516 carries the intermediate value $z_2=p_2$.

The output of the XOR gate 5110 carries the intermediate value $z_3=p_3$.

The output of the XOR gate 5114 carries the intermediate value $z_4=p_4$.

For k∈{1,2,3,4,9,10,11,12}, the first input of an XOR gate 52k is connected to the circuit input of the first subcircuit SZw 41 that carries the input signal $u_k$, and the second input of said XOR gate is connected to the circuit input of SZw 41 that carries the input signal $u_{k+4}$.

For $l \in \{1,2,3,4\}$, the output of the XOR gate $52l$ is connected to a first input of an XOR gate $52(l+4)$, the second input of which is connected to the output of the XOR gate $52(l+8)$.

The output of the XOR gate 525 carries the intermediate value $z_5 = q_1$.

The output of the XOR gate 526 carries the intermediate value $z_6 = q_2$.

The output of the XOR gate 527 carries the intermediate value $z_7 = q_3$.

The output of the XOR gate 528 carries the intermediate value $z_8 = q_4$.

In order to distinguish 1-bit errors from 2-bit errors in the check bits, a parity P is usually also formed over all the data bits in the case of uncompacted cross parity codes. If any data bit $u_i$ changes, then the total parity P also changes. No change occurs if a check bit is affected by an error. Using this total parity, it is therefore possible to distinguish 1-bit errors in the data bits from 2-bit errors in the data and check bits.

For the equations for correcting the row and column parities, the changes in the transformed check bits are used directly. If only the value of $c_2$ changes, for example, then also just the change $\Delta c_2$ is equal to one. Since $\Delta P$ is one only when a data bit is affected by a change, the following equation can be used for correcting $c_2$ $$c_2 = c_2' \oplus (\Delta c_2 \wedge \neg \Delta P).$$

For correcting the total parity P, it is possible to use a fact that, in the event of an exclusive change in P, there is also just a resultant change therein to one. For the correction, it is therefore possible to use the following equation $$P = P' \oplus (\neg (\Delta c_1 \vee \Delta c_2 \vee \Delta c_3 \vee \Delta c_4 \vee \Delta c_5 \vee \Delta c_6) \wedge \Delta P).$$

Hence, the correction circuit for P has the longest path. One way of shortening this path is to calculate it twice, once using the read row check bits and once using the read column check bits $$\Delta P^1 = c_1' \oplus c_2' \oplus c_3' \oplus P', \quad (40)$$

$$\Delta P^2 = c_4' \oplus c_5' \oplus c_6' \oplus P. \quad (41)$$

This is possible because $$P = u_1 \oplus u_2 \oplus \ldots \oplus u_{16} = c_1 \oplus c_2 \oplus c_3 = c_4 \oplus c_5 \oplus c_6. \quad (42)$$

For the correction equations for the data bits, this has no further effects. If the value of a row or column check bit changes, then the corresponding row or column change is accompanied by a change in the corresponding row total parity change $\Delta P^1$ or column total parity change $\Delta P^2$. For $c_2$, it is therefore now possible to use the following correction equation $$c_2 = c_2' \oplus (\Delta c_2 \wedge \Delta P^1).$$

For the correction of $c_4$, the column check bit used can be the following equation $$c_4 = c_4' \oplus (\Delta c_4 \wedge \Delta P^2).$$

For all the other row and column check bits, the equations are determined in a similar manner.

In the event of a 1-bit error in P, the changes $\Delta P^1$ and $\Delta P^2$ are determined to be one. This combination does not arise for any of the other 1-bit errors. Therefore, the following equation can be used for correcting P $$P = P' \oplus (\Delta P^1 \wedge \Delta P^2).$$

The equations for possible detection of 1-bit and 2-bit errors will now be presented. It should first of all be established that at least one of the changes is equal to one when two values in the bits of the read or received word have changed in comparison with the actual code word.

In principle, there are 3 ways for the individual components of a 2-bit error to be distributed over the intended array. Both errors are located in one row, both errors are located in one column or both errors are located in different rows and columns. In this case, it is irrelevant whether data bits or the check bits are affected by an error. The two total parity changes $\Delta P^1$ and $\Delta P^2$ provide information about whether there is a disruption in the last row or column.

Therefore, if two errors are located in the same row, none of the changes in the rows is equal to one, but two changes in the columns. Similarly, for two errors in one column, only two changes in the rows are equal to one. If both errors are in different rows and columns, two respective changes in the rows and columns are equal to one. Therefore, at least one of the changes is always equal to one.

So as now to separate 1-bit errors and 2-bit errors, the relationship specified in (42) can be used. The relationship reveals that the sum of all the bits in the code word must be even, that is to say $$0 = P' \oplus u_1' \oplus u_2' \oplus \ldots \oplus u_{16}' \oplus c_1' \oplus c_2'$$
$$\oplus c_3' \oplus c_4' \oplus c_5' \oplus c_6'.$$

It can be seen, when a 1-bit error occurs in one of the bits, that this sum then turns out to be one and turns out to be zero again in the case of a 2-bit error. The equation used for recognizing 1-bit errors can therefore be $$f_{1\text{-bit-error}} = P' \oplus u_1' \oplus u_2' \oplus \ldots \oplus u_{16}' \oplus c_1' \oplus c_2'$$
$$\oplus c_3' \oplus c_4' \oplus c_5' \oplus c_6' \quad (43).$$

For 2-bit error detection, it is possible to use $$f_{2\text{-bit-}} = \neg f_{1\text{-bit-error}} \wedge (\Delta c_1 \vee \Delta c_2 \vee \Delta c_3 \vee \Delta c_4 \vee \Delta c_5 \vee \Delta c_6)_{error} \quad (44).$$

Figure 6:
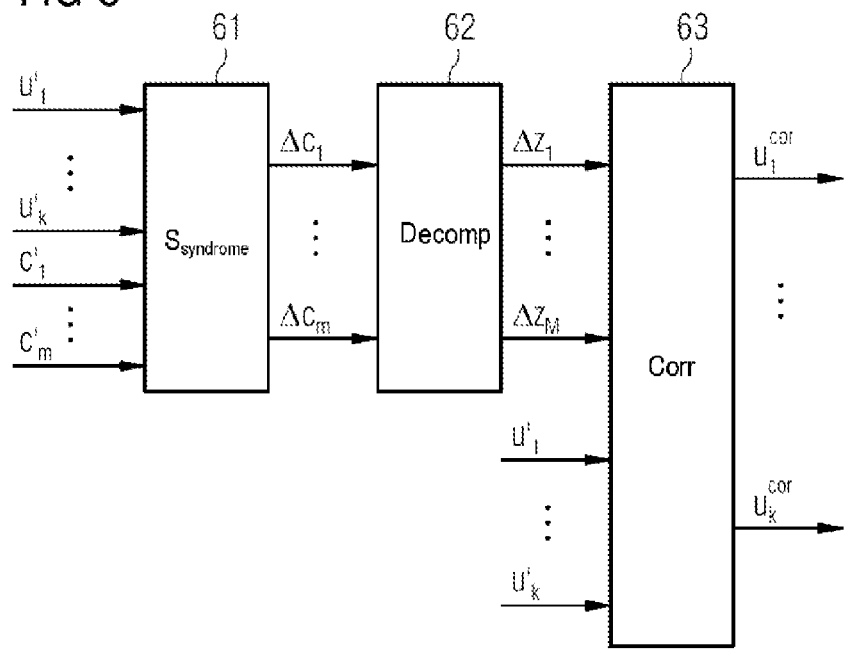
FIG. 6 shows a decoder for correcting data bits according to an embodiment.

FIG. 6 shows a decoder for determining a subset of data bits that are to be corrected on the basis of m check bits $c_1, \ldots, c_m$, the m check bits $c_1, \ldots, c_m$ being formed by a circuit arrangement for determining the check bits $c_1, \ldots, c_m$ for k data bits $u_1, \ldots, u_k$ in accordance with one of the preceding claims.

The decoder comprises:

a third subcircuit $S_{syndrome}$ 61 for forming a subset of differences $\Delta c_1 = c_1 \oplus c_1', \ldots, \Delta c_m = c_m \oplus c_m'$ for the correct check bits $c_1, \ldots, c_m$ and the possibly erroneous check bits $c_1', \ldots, c_m'$, these differences being determined from possibly erroneous data bits $u_1', \ldots, u_k'$ and possibly erroneous check bits $c_1', \ldots, c_m'$, a fourth subcircuit Decomp 62 for forming a subset of differences $\Delta z_1 = z_1 \oplus z_1', \ldots, \Delta z_M = z_M \oplus z_M'$ from error-free intermediate values $z_1, \ldots, z_M$ and possibly erroneous intermediate values $z_1', \ldots, z_M'$, the differences $\Delta z_1, \ldots \Delta z_M$ being determined from the differences in the intermediate values $\Delta c_1, \ldots, \Delta c_m$, and a fifth subcircuit Corr 63 for determining a corrected data bit $u_i^{cor}$ having at least three binary inputs for inputting the possibly erroneous data bit $u_1'$ and for inputting two differences $\Delta z_{1,l_j}, \Delta z_{2,r_j}$ for intermediate values and a binary output for outputting the corrected data bit $u_i^{cor}$, wherein $z_{1,l_j}$ belongs to a first group of intermediate values and $z_{2,r_j}$ belongs to a second group of intermediate values, so that, when $u_j$ changes to $\overline{u_j}$ and also no error occurs, $z_{1,l_j}$ changes to $\overline{z_{1,l_j}}$ and $z_{2,r_j}$ changes to $\overline{z_{2,r_j}}$ and the fifth subcircuit Corr is designed such that it outputs $u_j^{cor} = u_j \oplus 1$ when $\Delta z_{1,l_j} = \Delta z_{2,r_j} = 1$.

In particular, FIG. 6 shows an example embodiment of a decoder that is constructed from the three subcircuits Syndrome 6.1, Decomp 6.2 and Corr 6.3.

The m+k inputs of the subcircuit Syndrome 6.1 have the values $u_1', \ldots, u_k'$ of the possibly erroneous k data bits and of the values $c_1', \ldots, c_m'$ of the possibly erroneous m check bits supplied to them, said values having been read from a memory, for example.

The subcircuit Syndrome 6.1 outputs the changes in the check bits $\Delta c_1 = c_1' \oplus c_1, \ldots, \Delta c_m = c_m' \oplus c_m$ at its m outputs.

The subcircuit Decomp 6.2 forms changes in the intermediate values $\Delta z_1 = z_1' \oplus z_1, \ldots, \Delta z_M = z_M' \oplus z_M$ from the changes in the check bits $\Delta c_1, \ldots, \Delta c_m$.

If precisely one data bit, for example $u_j$, is disrupted into $\bar{u}_j = u_j'$, while all the remaining data bits and check bits are error-free, then two changes in the intermediate values $\Delta z_{1,l_j}$ and $\Delta z_{2,r_j}$ are equal to one, while all the remaining changes in intermediate values are equal to zero. $z_{1,l_j}$ belongs to a first group of intermediate values and $z_{2,r_j}$ belongs to a second group of intermediate values.

The corrector Corr 6.3 forms the corrected bits.

FIG. 6 shows the case in which the data bits are corrected and the check bits are not corrected. It is also possible for just one data bit, a subset of the data bits or data and check bits to be corrected.

In FIG. 6, the subcircuit Corr 6.3 has M+k inputs for inputting the differences in the intermediate values $\Delta z_1, \ldots, \Delta z_M$ and the data bits $u_1', \ldots, u_k'$ that are to be corrected. In addition, it has k outputs for outputting the k corrected values of the data bits $u_1^{corr}, \ldots, u_k^{corr}$.

In this case, the subcircuit Corr 6.3 is designed such that $u_j^{cor} = u_j \oplus 1$ when $\Delta z_{1,l_j} = \Delta z_{2,r_j} = 1$ and all the other differences in the output intermediate values are equal to zero.

In a further example embodiment, 36 useful data bits $u_1, \ldots, u_{36}$ will be considered that are notionally arranged in a 6×6 array and are determined for the 12 intermediate values $z_1, \ldots, z_{12}$.

The intermediate values $z_1 = p_1, \ldots, z_6 = p_6$ are formed as the row parities $p_1, \ldots, p_6$ of a 6×6 array from the 36 useful data bits, and the intermediate values $z_7 = q_1, \ldots, z_{12} = q_6$ are formed as the column parities $q_1, \ldots, q_6$. In this example embodiment, the intermediate values can also be referred to as row and column parities. The following apply:

$$z_1 = p_1 = u_1 \oplus u_2 \oplus u_3 \oplus u_4 \oplus u_5 \oplus u_6, \tag{45}$$

$$z_2 = p_2 = u_7 \oplus u_8 \oplus u_9 \oplus u_{10} \oplus u_{11} \oplus u_{12}, \tag{46}$$

$$z_3 = p_3 = u_{13} \oplus u_{14} \oplus u_{15} \oplus u_{16} \oplus u_{17} \oplus u_{18}, \tag{47}$$

$$z_4 = p_4 = u_{19} \oplus u_{20} \oplus u_{21} \oplus u_{22} \oplus u_{23} \oplus u_{24}, \tag{48}$$

$$z_5 = p_5 = u_{25} \oplus u_{26} \oplus u_{27} \oplus u_{28} \oplus u_{29} \oplus u_{30}, \tag{49}$$

$$z_6 = p_6 = u_{31} \oplus u_{32} \oplus u_{33} \oplus u_{34} \oplus u_{35} \oplus u_{36}, \tag{50}$$

$$z_7 = q_1 = u_1 \oplus u_7 \oplus u_{13} \oplus u_{19} \oplus u_{25} \oplus u_{31}, \tag{51}$$

$$z_8 = q_2 = u_2 \oplus u_8 \oplus u_{14} \oplus u_{20} \oplus u_{26} \oplus u_{32}, \tag{52}$$

$$z_9 = q_3 = u_3 \oplus u_9 \oplus u_{15} \oplus u_{21} \oplus u_{27} \oplus u_{33}, \tag{53}$$

$$z_{10} = q_4 = u_4 \oplus u_{10} \oplus u_{16} \oplus u_{22} \oplus u_{28} \oplus u_{34}, \tag{54}$$

$$z_{11} = q_5 = u_5 \oplus u_{11} \oplus u_{17} \oplus u_{23} \oplus u_{29} \oplus u_{35}, \tag{55}$$

$$z_{12} = q_6 = u_6 \oplus u_{12} \oplus u_{18} \oplus u_{24} \oplus u_{30} \oplus u_{36}. \tag{56}$$

The intermediate values $z_1 = p_1, \ldots, z_{12} = q_6$ form two groups $G_1$ and $G_2$ of intermediate values $$G_1 = \{z_1 = p_1, z_2 = p_2, z_3 = p_3, z_4 = p_5, z_6 = p_6\},$$

$$G_2 = \{z_7 = q_1, z_8 = q_2, z_9 = q_3, z_{10} = q_5, z_{12} = q_6\}.$$

In this case, the groups $G_1$ and $G_2$ are formed such that a change in a data bit $u_i$ to $\bar{u}_i$ results in the change in precisely one intermediate value from $G_1$ and in the change in an intermediate value from $G_2$ when no further data bit changes. Similarly: if precisely one intermediate value from $G_1$ changes and if precisely one intermediate value from $G_2$ simultaneously changes, then precisely one data bit changes. If a total parity $$P = u_1 \oplus u_2 \oplus \ldots \oplus u_{36}$$

is existent, then $G_3 = \{P\}$ forms a separate group in this example embodiment. According to one embodiment, it is possible to compact the 12 intermediate values $z_1, \ldots, z_{12}$ into 8 check bits.

To this end, it is possible to transform the first 6 intermediate values $z_1, \ldots, z_6$ according to the relationship $$(c_1, c_2, c_3, c_4) = A \cdot (z_1, z_2, z_3, z_4, z_5, z_6) \tag{57}$$

and the second 6 intermediate values $z_7, \ldots, z_{12}$ according to the relationship $$(c_5, c_6, c_7, c_8) = A \cdot (z_7, z_8, z_9, z_{10}, z_{11}, z_{12}) \tag{58},$$

where $$A = \begin{pmatrix} 1 & 0 & 0 & 0 & 1 & 0 \\ 0 & 1 & 0 & 0 & 1 & 1 \\ 0 & 0 & 1 & 0 & 1 & 1 \\ 0 & 0 & 0 & 1 & 0 & 1 \end{pmatrix}, \tag{59}$$

into the check bits $c_1, \ldots, c_8$.
Explicitly, $$c_1 = z_1 \oplus z_5 = p_1 \oplus p_5, \tag{60}$$

$$c_2 = z_2 \oplus z_5 \oplus z_6 = p_2 \oplus p_5 \oplus p_6, \tag{61}$$

$$c_3 = z_3 \oplus z_5 \oplus z_6 = p_3 \oplus p_5 \oplus p_6, \tag{62}$$

$$c_4 = z_4 \oplus z_6 = p_4 \oplus p_6, \tag{63}$$

$$c_5 = z_7 \oplus z_{11} = q_1 \oplus q_5, \tag{64}$$

$$c_6 = z_8 \oplus z_{11} \oplus z_{12} = q_2 \oplus q_5 \oplus q_6, \tag{65}$$

$$c_7 = z_9 \oplus z_{11} \oplus z_{12} = q_3 \oplus q_5 \oplus q_6, \tag{66}$$

$$c_8 = z_{10} \oplus z_{12} = q_4 \oplus q_6. \tag{67}$$

When a total parity P has been formed, it is not transformed in this example embodiment.

Implementing relationships (45) to (56) and (60) to (67) using XOR gates is not a problem for a person skilled in the art, which means that it is not discussed in more detail.

The matrix A, which stipulates how the intermediate values are transformed into check bits, has the following properties:

1. All the columns of the matrix A differ in pairs.
2. All the columns of the matrix A have an uneven number of ones.

These are precisely the properties of a matrix for a Hsiao code.

For $c_2$ and $c_3$, 2 XOR gate stages are required for the transformation. If faster coding is demanded and more check bits are permitted, the code can be adapted in accordance with these requirements.

The transformation of the 12 intermediate values $z_1, \ldots, z_{12}$ onto 10 check bits $c_1, \ldots, c_{10}$ can now be effected using a matrix $A'$ $$A' = \begin{pmatrix} 1 & 0 & 0 & 0 & 0 & 1 \\ 0 & 1 & 0 & 0 & 0 & 1 \\ 0 & 0 & 1 & 0 & 0 & 1 \\ 0 & 0 & 0 & 1 & 0 & 0 \\ 0 & 0 & 0 & 0 & 1 & 0 \end{pmatrix}, \quad (68)$$

so that $$(c_1,c_2,c_3,c_4,c_5) = A' \cdot (z_1,z_2,z_3,z_4,z_5,z_6)$$

and $$(c_6,c_7,c_8,c_9,c_{10}) = A' \cdot (z_7,z_8,z_9,z_{10},z_{11},z_{12}).$$

Then, for $c_1, \ldots, c_5$, $$c_1 = p_1 \oplus p_6,$$
$$c_2 = p_2 \oplus p_6,$$
$$c_3 = p_3 \oplus p_6,$$
$$c_4 = p_4,$$
$$c_5 = p_5$$

and, for $c_6, \ldots, c_{10}$, $$c_6 = q_1 \oplus q_6,$$
$$c_7 = q_2 \oplus q_6,$$
$$c_8 = q_3 \oplus q_6,$$
$$c_9 = q_4,$$
$$c_{10} = q_5.$$

All the columns of the matrix $A'$ are pairwise different and each column of $A'$ has an odd number of ones, so that $A'$ is again an H matrix for a Hsiao code.

It is possible to infer from the equations that one gate stage can be saved in comparison with a transformation using (59), an additional check bit being needed. An implementation of the second transformation therefore has a shorter delay than an implementation of the first transformation.

In a further application example, 9 data bits $u_1, \ldots, u_9$ will now be considered. The 9 data bits $u_1, \ldots, u_9$ are notionally arranged as a 3×3 array.

Initially, a total of 7 intermediate values $z_1, \ldots, z_7$ $$z_1 = p_1 = u_1 \oplus u_2 \oplus u_3,$$
$$z_2 = p_2 = u_4 \oplus u_5 \oplus u_6,$$
$$z_3 = p_3 = u_7 \oplus u_8 \oplus u_9,$$
$$z_4 = q_1 = u_1 \oplus u_4 \oplus u_7,$$
$$z_5 = q_2 = u_2 \oplus u_5 \oplus u_8,$$
$$z_6 = q_3 = u_3 \oplus u_6 \oplus u_9,$$
$$z_7 = P = u_1 \oplus u_2 \oplus \ldots \oplus u_9$$

are now formed. The intermediate values $z_1 = p_1$, $z_2 = p_2$, $z_3 = p_3$ are now transformed according to the relationship $$(c_1,c_2) = A'' \cdot (p_1,p_2,p_3) \quad (69)$$

and the intermediate values $z_4 = q_1$, $z_5 = q_2$, $z_6 = q_3$ are transformed according to the relationship $$(c_3,c_4) = A'' \cdot (q_1,q_2,q_3) \quad (70),$$

where $$A'' = \begin{pmatrix} 1 & 0 & 1 \\ 0 & 1 & 1 \end{pmatrix}, \quad (71)$$

so that $$c_1 = p_1 \oplus p_3,$$
$$c_2 = p_2 \oplus p_3,$$
$$c_3 = q_1 \oplus q_3,$$
$$c_4 = q_2 \oplus q_3.$$

All the columns of the matrix $A''$ are pairwise different and $A''$ is the H matrix for a Hamming code.

For the purpose of error correction, the changes $\Delta c_1$, $\Delta c_2$, $\Delta c_3$, $\Delta c_4$, $\Delta P$ are first of all determined, with $u_1', \ldots, u_9'$, $c_1', \ldots, c_4'$, $P'$ being the possibly erroneous values read from the memory. The following apply:

$$\Delta c_1 = c_1' \oplus u_1' \oplus u_2' \oplus u_3' \oplus u_7' \oplus u_8' \oplus u_9',$$
$$\Delta c_2 = c_2' \oplus u_4' \oplus u_5' \oplus u_6' \oplus u_7' \oplus u_8' \oplus u_9',$$
$$\Delta c_3 = c_3' \oplus u_1' \oplus u_4' \oplus u_7' \oplus u_3' \oplus u_6' \oplus u_9',$$
$$\Delta c_4 = c_4' \oplus u_2' \oplus u_5' \oplus u_8' \oplus u_3' \oplus u_6' \oplus u_9',$$
$$\Delta P = P' \oplus u_1' \oplus u_2' \oplus \ldots \oplus u_9'.$$

The changes $\Delta z_1 = \Delta p_1$, $\Delta z_2 = \Delta p_2$, $\Delta z_3 = \Delta p_3$, $\Delta z_4 = \Delta q_1$, $\Delta z_5 = \Delta q_2$, $\Delta z_6 = \Delta q_3$, $\Delta z_7 = \Delta P$ in the intermediate values are $$\Delta z_1 = \Delta p_1 = \Delta c_1 \wedge \neg \Delta c_2,$$
$$\Delta z_2 = \Delta p_2 = \Delta c_2 \wedge \neg \Delta c_1,$$
$$\Delta z_3 = \Delta p_3 = \Delta c_1 \wedge \Delta c_2,$$
$$\Delta z_4 = \Delta q_1 = \Delta c_3 \wedge \neg \Delta c_4,$$
$$\Delta z_5 = \Delta q_2 = \Delta c_4 \wedge \neg \Delta c_3,$$
$$\Delta z_6 = \Delta q_3 = \Delta c_3 \wedge \Delta c_4,$$
$$\Delta z_7 = \Delta P.$$

Furthermore, the correction of the data bits $u_1', \ldots, u_9'$ implements the relationships $$u_1 = u_1' \oplus (\Delta p_1 \wedge \Delta q_1),$$
$$u_2 = u_2' \oplus (\Delta p_1 \wedge \Delta q_2),$$
$$u_3 = u_3' \oplus (\Delta p_1 \wedge \Delta q_3),$$
$$u_4 = u_4' \oplus (\Delta p_2 \wedge \Delta q_1),$$
$$u_5 = u_5' \oplus (\Delta p_2 \wedge \Delta q_2),$$
$$u_6 = u_6' \oplus (\Delta p_2 \wedge \Delta q_3),$$
$$u_7 = u_7' \oplus (\Delta p_3 \wedge \Delta q_1),$$
$$u_8 = u_8' \oplus (\Delta p_3 \wedge \Delta q_2),$$
$$u_9 = u_9' \oplus (\Delta p_3 \wedge \Delta q_3),$$

The error detection can be effected by implementing the equation $$E_{error} = \Delta c_1 \vee \Delta c_2 \vee \Delta c_3 \vee \Delta c_4 \vee \Delta P \quad (72).$$

The error detection for a 1-bit error in the useful data is output by a circuit that implements $$E_{1\text{-}bit\text{-}error} = (u_1 \oplus u_2 \oplus \ldots \oplus u_9 \oplus P') \quad (73).$$

In a further application example, 14 data bits $u_1, \ldots, u_{14}$ will now be considered.

Nine intermediate values $z_1, \ldots, z_9$ are determined according to the relationships $$z_1 = u_1 \oplus u_2 \oplus u_3 \oplus u_4, z_2 = u_1 \oplus u_5 \oplus u_9,$$

$$z_3 = u_5 \oplus u_6 \oplus u_7 \oplus u_8, z_4 = u_{12} \oplus u_{14} \oplus u_7,$$

$$z_5 = u_9 \oplus u_{10} \oplus u_{11} \oplus u_{12}, z_6 = u_{10} \oplus u_{13} \oplus u_3,$$

$$z_7 = u_{13} \oplus u_{14}, z_8 = u_2 \oplus u_6 \oplus u_{11},$$

$$z_9 = u_4 \oplus u_8.$$

For the total parity P, $$P = u_1 \oplus u_2 \oplus \ldots \oplus u_{14}.$$

The intermediate values $z_1, z_2, \ldots, z_9$ are now distributed over 2 groups $$G_1 = \{z_1, z_3, z_5, z_7\}.$$

$$G_2 = \{z_2, z_4, z_6, z_8, z_9\}.$$

If $u_1$ changes to $\overline{u_1}$, then $z_1$ from $G_1$ changes to $\overline{z_1}$ and $z_2$ from $G_2$ changes to $\overline{z_2}$.

If $u_2$ changes to $\overline{u_2}$, then $z_1$ from $G_1$ changes to $\overline{z_1}$ and $z_8$ from $G_2$ changes to $\overline{z_8}$.

For all the remaining data bits $u_j$, $j = 3, \ldots, 14$, it can similarly be shown that, when $u_j$ changes to $\overline{u_j}$, a first intermediate value from $G_1$ and a second intermediate value from $G_2$ change.

The intermediate values in the two groups are now transformed onto 3 and 4 check bits, respectively. In this case, the following relationships apply:

$$(c_1, c_2, c_3) = A_1 \cdot (z_1, z_3, z_5, z_7), \quad (74)$$

$$(c_4, c_5, c_6, c_7) = A_2' \cdot (z_2, z_4, z_6, z_8, z_9). \quad (75)$$

The matrices $A_1$ and $A_2'$ used are $$A_1 = \begin{pmatrix} 1 & 0 & 0 & 1 \\ 0 & 1 & 0 & 1 \\ 0 & 0 & 1 & 1 \end{pmatrix},$$

$$A_2' = \begin{pmatrix} 1 & 0 & 0 & 0 & 1 \\ 0 & 1 & 0 & 0 & 1 \\ 0 & 0 & 1 & 0 & 1 \\ 0 & 0 & 0 & 1 & 0 \end{pmatrix}.$$

From relationships (74) and (75), the equations $$c_1 = z_1 \oplus z_7, c_4 = z_2 \oplus z_9,$$

$$c_2 = z_3 \oplus z_7, c_5 = z_4 \oplus z_9,$$

$$c_3 = z_5 \oplus z_7, c_6 = z_6 \oplus z_9,$$

$$c_7 = z_8$$

are determined.

The text below considers an example embodiment with 36 data bits $u_1, \ldots, u_{36}$ that are notionally considered to be arranged as a 6×6 array. The 12 intermediate values $z_1, \ldots, z_{12}$ and the total parity P can then be formed as follows:

$$z_1 = p_1 = u_1 \oplus u_2 \oplus u_3 \oplus u_4 \oplus u_5 \oplus u_6,$$

$$z_2 = p_2 = u_7 \oplus u_8 \oplus u_9 \oplus u_{10} \oplus u_{11} \oplus u_{12},$$

$$z_3 = p_3 = u_{13} \oplus u_{14} \oplus u_{15} \oplus u_{16} \oplus u_{17} \oplus u_{18},$$

$$z_4 = p_4 = u_{19} \oplus u_{20} \oplus u_{21} \oplus u_{22} \oplus u_{23} \oplus u_{24},$$

$$z_5 = p_5 = u_{25} \oplus u_{26} \oplus u_{27} \oplus u_{28} \oplus u_{29} \oplus u_{30},$$

$$z_6 = p_6 = u_{31} \oplus u_{32} \oplus u_{33} \oplus u_{34} \oplus u_{35} \oplus u_{36},$$

$$z_7 = q_1 = u_1 \oplus u_7 \oplus u_{13} \oplus u_{19} \oplus u_{25} \oplus u_{31},$$

$$z_8 = q_2 = u_2 \oplus u_8 \oplus u_{14} \oplus u_{20} \oplus u_{26} \oplus u_{32},$$

$$z_9 = q_3 = u_3 \oplus u_9 \oplus u_{15} \oplus u_{21} \oplus u_{27} \oplus u_{33},$$

$$z_{10} = q_4 = u_4 \oplus u_{10} \oplus u_{16} \oplus u_{22} \oplus u_{28} \oplus u_{34},$$

$$z_{11} = q_5 = u_5 \oplus u_{11} \oplus u_{17} \oplus u_{23} \oplus u_{29} \oplus u_{35},$$

$$z_{12} = q_6 = u_6 \oplus u_{12} \oplus u_{18} \oplus u_{24} \oplus u_{30} \oplus u_{36},$$

$$P = u_1 \oplus u_2 \oplus \ldots \oplus u_{36}.$$

The intermediate values $z_1 = p_1, \ldots, z_6 = p_6$ can also be referred to as row parities.

The intermediate values $z_7 = q_1, \ldots, z_{12} = q_6$ can also be referred to as column parities.

It is now possible to form further intermediate values $z_{13} = d_1, \ldots, z_{19} = d_7$ according to the relationships $$z_{13} = d_1 = u_1 \oplus u_8 \oplus u_{15} \oplus u_{22} \oplus u_{29} \oplus u_{36} \oplus P,$$

$$z_{14} = d_2 = u_2 \oplus u_9 \oplus u_{16} \oplus u_{23} \oplus u_{30} \oplus p_6 \oplus q_1,$$

$$z_{15} = d_3 = u_3 \oplus u_{10} \oplus u_{17} \oplus u_{24} \oplus p_5 \oplus u_{31} \oplus q_2,$$

$$z_{16} = d_4 = u_4 \oplus u_{11} \oplus u_{18} \oplus p_4 \oplus u_{25} \oplus u_{32} \oplus q_3,$$

$$z_{17} = d_5 = u_5 \oplus u_{12} \oplus p_3 \oplus u_{19} \oplus u_{26} \oplus u_{33} \oplus q_4,$$

$$z_{18} = d_6 = u_6 \oplus p_2 \oplus u_{13} \oplus u_{20} \oplus u_{27} \oplus u_{34} \oplus q_5,$$

$$z_{19} = d_7 = p_1 \oplus u_7 \oplus u_{14} \oplus u_{21} \oplus u_{28} \oplus u_{35} \oplus q_6,$$

The intermediate values $z_{13} = d_1, \ldots, z_{19} = d_7$ can be referred to as diagonal parities.

Obviously, the respective row parities $p_1, \ldots, p_6$ can be appended to the 6 rows of the 6×6 array of the 36 useful data bits. Similarly, the 6 column parities $q_1, \ldots, q_6$ can be appended to the 6 columns of the 6×6 array. In addition, the total parity P can be added in the bottom right-hand field, so that a 7×7 array is now formed from the data bits $u_1, \ldots, u_{36}$ and the row and column parities $p_1, \ldots, p_6, q_1, \ldots, q_6$ and the total parity P.

The intermediate values $z_{13} = d_1, \ldots, z_{19} = d_7$ then correspond to the diagonal parities, as are described in the work by E. J. Wieder "N-dimensional Codes for Detecting Four Errors and Correcting Three", Master Thesis, Moore School of Electrical Engineering, Philadelphia, 1961, chapter V, pp. 2-3.

The additional diagonals can be used to locate 2-bit errors. If both error components of a 2-bit error are located in the same row, for example, then exclusive consideration of the row and column parities allows two changes to be observed in two columns, but not in the rows. Hence, although the two columns that contain the errors must be locatable, the row must not. The use of the diagonal adds a third dimension too, which can be used to locate the two erroneous bits again.

It is possible, for example, for the 7 intermediate values $z_{13}=d_1, \ldots, z_{19}=d_7$ to be transformed into 4 check bits $c_1$, $c_2$, $c_3$, $c_4$ according to the relationships $$c_1=d_1 \oplus d_5 \oplus d_7,$$

$$c_2=d_2 \oplus d_5 \oplus d_6,$$

$$c_3=d_3 \oplus d_5 \oplus d_6 \oplus d_7,$$

$$c_4=d_4 \oplus d_6 \oplus d_7$$

and for the other intermediate values $z_1, \ldots, z_{12}$ to be left unchanged.

Similarly, it is possible for just the intermediate values $z_1, \ldots, z_6$ and $z_7, \ldots, z_{12}$ to be transformed and for the intermediate values $z_{13}, \ldots, z_{19}$ and the total parity P not to be transformed.

Figure 7:
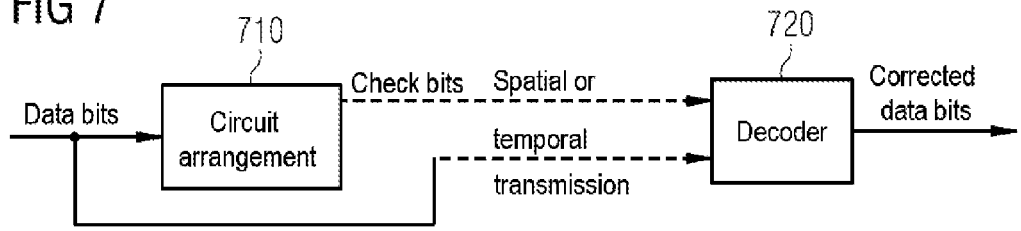
FIG. 7 shows a system according to an embodiment, comprising a circuit arrangement and a decoder for determining a subset of data bits that are to be corrected.
Figure 8:
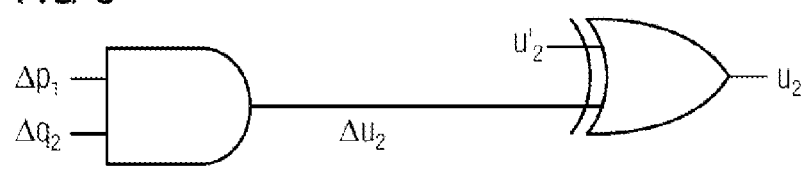
FIG. 8 shows an AND gate and an XOR gate, with the correction of a single data bit involving the syndrome component of the row and column in which the data bit is logically located being logically combined by the AND gate and the result being linked to the read data bit by means of the XOR gate.

FIG. 7 shows a system comprising a circuit arrangement 710 according to one of the embodiments described above and a decoder 720 for determining a subset of data bits that are to be corrected according to one of the embodiments described above. The circuit arrangement 710 produces check bits on the basis of received data bits. When a correction is necessary, the decoder 720 produces corrected data bits on the basis of received input data bits and the received check bits.

For the spatial and/or temporal transmission and the channel model, see [7], in particular.

In a specific example embodiment, a cross parity code for 16 useful data bits $u_1, \ldots, u_{16}$ will be considered, the data bits of which are notionally arranged in a 4×4 array.

For this specific example embodiment, the circuit arrangement 710 is formed by at least 16 inputs for the 16 useful data bits $u_1, \ldots, u_{16}$ and at least 6 outputs for the 6 check bits $c_1, \ldots, c_6$ calculated from the data bits. The 6 check bits may have been determined in accordance with encoder equations (15) to (22) and (26) to (31).

As inputs, the decoder 720 has at least 16 inputs for the 16 received possibly erroneous useful data bits $u_1', \ldots, u_{16}'$ and 6 inputs for the 6 received possibly erroneous check bits $c_1', c_2', \ldots, c_6'$. The changes $\Delta c_1, \ldots, \Delta c_6$ calculated in the decoder 720 may have been determined by the equations $$\Delta c_1 = c_1' \oplus u_2' \oplus u_3' \oplus u_4' \oplus u_{13}' \oplus u_{14}' \oplus u_{15}' \oplus u_{16}',$$

$$\Delta c_2 = c_2' \oplus u_5' \oplus u_6' \oplus u_7' \oplus u_8' \oplus u_{13}' \oplus u_{14}' \oplus u_{15}' \oplus u_{16}',$$

$$\Delta c_3 = c_3' \oplus u_9' \oplus u_{10}' \oplus u_{11}' \oplus u_{12}' \oplus u_{13}' \oplus u_{14}' \oplus u_{15}' \oplus u_{16}',$$

$$\Delta c_4 = c_4' \oplus u_1' \oplus u_5' \oplus u_9' \oplus u_{13}' \oplus u_4' \oplus u_8' \oplus u_{12}' \oplus u_{16}',$$

$$\Delta c_5 = c_5' \oplus u_2' \oplus u_6' \oplus u_{10}' \oplus u_{14}' \oplus u_4' \oplus u_8' \oplus u_{12}' \oplus u_{16}',$$

$$\Delta c_6 = c_6' \oplus u_1' \oplus u_7' \oplus u_{11}' \oplus u_{15}' \oplus u_4' \oplus u_8' \oplus u_{12}' \oplus u_{16}',$$

The further correction of a subset of data bits, all the data bits or all the data and check bits may be implemented as set out in other preceding example embodiments.

Although some aspects have been described in connection with an apparatus, it goes without saying that these aspects are also a description of the corresponding method, which means that the block or a component of an apparatus is also intended to be understood to mean a corresponding method step or to mean a feature of a method step. Similarly, aspects that have been described in connection with or as a method step are also a description of a corresponding block or detail or feature of a corresponding apparatus. Some or all of the method steps can be performed by a hardware apparatus (or using a hardware apparatus), such as a microprocessor, a programmable computer or an electronic circuit. In the case of some example embodiments, some or several of the most important method steps can be performed by such an apparatus.

Depending on particular implementation requirements, example embodiments of the disclosure may be implemented in hardware or in software. The implementation can be performed using a digital storage medium, for example a floppy disk, a DVD, a BluRay Disk, a CD, a ROM, a PROM, an EPROM, an EEPROM or a FLASH memory, a hard disk or another magnetic or optical memory that stores electronically readable control signals that can interact or do interact with a programmable computer system such that the respective method is performed. Therefore, the digital storage medium may be computer-readable.

Some example embodiments according to the disclosure thus comprise a data storage medium that has electronically readable control signals that are capable of interacting with a programmable computer system such that one of the methods described herein is performed.

In general, example embodiments of the present disclosure may be implemented as a computer program product with a program code, the program code being effective for performing one of the methods when the computer program product is executed on a computer.

By way of example, the program code may also be stored on a machine-readable storage medium.

Other example embodiments comprise the computer program for performing one of the methods described herein, wherein the computer program is stored on a machine-readable storage medium. In other words, one example embodiment of the method according to the disclosure is therefore a computer program that has a program code for performing one of the methods described herein when the computer program is executed on a computer.

A further example embodiment of the methods according to the disclosure is therefore a data storage medium (or a digital storage medium or a computer-readable medium) on which the computer program for performing one of the methods described herein is recorded.

A further example embodiment of the method according to the disclosure is therefore a data stream or a sequence of signals that is/are the computer program for performing one of the methods described herein. By way of example, the data stream or the sequence of signals may be configured to be transferred via a data communication link, for example via the Internet.

A further example embodiment comprises a processing device, for example a computer or a programmable logic component, that is configured or customized to perform one of the methods described herein.

A further example embodiment comprises a computer on which the computer program for performing one of the methods described herein is installed.

A further example embodiment according to the disclosure comprises an apparatus or a system that is designed to transmit a computer program for performing at least one of the methods described herein to a receiver. By way of example, the transmission can be effected electronically or optically. By way of example, the receiver may be a computer, a mobile appliance, a storage appliance or a similar apparatus. By way of example, the apparatus or the system may comprise a file server for transmitting the computer program to the receiver.

In some example embodiments, a programmable logic component (for example a field-programmable gate array, an FPGA) can be used to perform some or all functionalities of the methods described herein. In some example embodiments, a field-programmable gate array can interact with a microprocessor in order to perform one of the methods described herein. In general, the methods in some example embodiments are performed by any hardware apparatus. This may be a universally usable piece of hardware such as a computer processor (CPU), or hardware that is specific to the method, such as an ASIC.

The example embodiments described above are merely an illustration of the principles of the present disclosure. It goes without saying that modifications and variations for the arrangements and details described herein will be apparent to other persons skilled in the art. The intention is therefore that the disclosure be limited merely by the scope of protection of the patent claims that follow rather than by the specific details that have been presented herein on the basis of the description and the explanation of the example embodiments.

Further examples of embodiments may include
diagonal parities which are formed by XOR ing data bits.
diagonal parity bits which are formed by XOR functions on the basis of data bits, row parity bits and column parity bits.
a second subcircuit for transforming intermediate values into check bits which is a linear circuit.

Further embodiments may include a circuit arrangement, wherein $M'=M_1$ and the subset $\{z_{1'}, \ldots, z_{M'}\}$ of the intermediate values is equal to the set of the intermediate values $\{z_{1,1}, \ldots, z_{1,M_1}\}$ from the group $G_1$ of intermediate values.

Further embodiments may include a decoder, wherein, in the event of a 1-bit error in the data bits u', the change in the data bit $\Delta u_i$, where $0 \leq i \leq k$, can be presented as the product of n changes, where $n \geq 2$, in the intermediate values.

Further embodiments may include a circuit arrangement for determining m check bits $c_1, \ldots, c_m$ for k data bits $u_1, \ldots, u_k$, comprising: a first subcircuit, and a second subcircuit, wherein the first subcircuit has SZw k binary inputs for inputting the k data bits $u=u_1, \ldots, u_k$ and M binary outputs for outputting M binary intermediate values $z_1, \ldots, z_M$ determined from the data bits, where $$z_1 = z_1(u) = z_1(u_1, \ldots, u_k), \ldots z_M = z_M(u) = z_M(u_1, \ldots, u_k),$$

wherein the intermediate values form at least a first group $G_1 = \{z_{1,1}, z_{1,2}, \ldots, z_{1,M_1}\}$ of $M_1$ intermediate values and a second group $G_2 = \{z_{2,1}, z_{2,2}, \ldots, z_{2,M_2}\}$ of $M_2$ intermediate values, which is different than $G_1$, wherein the first group $G_1$ and the second group $G_2$ have different intermediate values and $2 \leq M_1, M_2 \leq M$, and the first subcircuit SZw is designed such that it determines the intermediate values from the data bits such that there is an association between a determined pair of intermediate values $z_{1,l_j}, z_{2,m_j}$ for each data bit $u_j$ that is to be corrected, where $z_{1,l_j}$ is an intermediate value from the first group $G_1$ and $z_{2,m_j}$ is an intermediate value from the second group $G_2$, which is different than the intermediate value from the first group, so that $$z_{1,l_j}(u_1, \ldots, u_{j-1}, \bar{u}_j, u_{j+1}, \ldots, u_k) = \bar{z}_{1,l_j}(u_1, \ldots, u_{j-1}, u_j, u_{j+1}, \ldots, u_k)$$

$$z_{2,m_j}(u_1, \ldots, u_{j-1}, \bar{u}_j, u_{j+1}, \ldots, u_k) = \bar{z}_{2,m_j}(u_1, \ldots, u_{j-1}, u_j, u_{j+1}, \ldots, u_k)$$

and a change in the pair $z_{1,l_j}, z_{2,m_j}$ to $\bar{z}_{1,l_j}, \bar{z}_{2,m_j}$ when only one data bit from the data bits $\{u_1, \ldots, u_k\}$ has changed to its negated value indicates that the j-th data bit $u_j$ has changed to $\bar{u}_j$ wherein the second subcircuit Tr is configured to transform the intermediate values $z_1, \ldots, z_M$ into the check bits $c_1, \ldots, c_m$, wherein the second subcircuit Tr is designed such that it transforms the intermediate values $z_{j,1}, \ldots, z_{j,M_j}$ from at least one group $G_j$, of intermediate values into check bits $$c_{j,1}, \ldots, c_{j,h_j}(z_{j,1}, \ldots, z_{j,k}, \ldots, z_{j,M_j}),$$

so that the check bits associated with the intermediate values $$z_{j,1}(u_1, \ldots, u_i, \ldots, u_k), \ldots z_{j,i}(u_1, \ldots, u_i, \ldots, u_k), \ldots z_{j,M_j}(u_1, \ldots, u_i, \ldots, u_k)$$

determined from the data bits $u_1, \ldots, u_i, \ldots, u_k$ and the check bits associated with the intermediate values $$z_{j,1}(\bar{u}_1, \ldots, u_i, \ldots, u_k), \ldots, z_{j,i}(\bar{u}_1, \ldots, u_i, \ldots, u_k), \ldots,$$
$$z_{j,M_j}(\bar{u}_1, \ldots, u_i, \ldots u_k)$$
$$\vdots$$
$$z_{j,1}(u_1, \ldots, \bar{u}_i, \ldots, u_k), \ldots, z_{j,i}(u_1, \ldots, \bar{u}_i, \ldots, u_k), \ldots,$$
$$z_{j,M_j}(u_1, \ldots, \bar{u}_i, \ldots, u_k)$$
$$\vdots$$
$$z_{j,1}(u_1, \ldots, u_i, \ldots, \bar{u}_k), \ldots, z_{j,i}(u_1, \ldots, u_i, \ldots, \bar{u}_k), \ldots,$$
$$z_{j,M_j}(u_1, \ldots, u_i, \ldots, \bar{u}_k)$$

determined from the data bits inverted in a respective bit differ in pairs, where $m < M$ and $h_j < M_j$ Further embodiments may include a circuit arrangement which has been realized using a synthesis tool and/or a decoder which has been realized using a synthesis tool.

The invention claimed is:

1. A circuit arrangement for determining m check bits $c_1, \ldots, c_m$ for k data bits $u_1, \ldots, u_k$, wherein the circuit arrangement comprises:
    a first subcircuit having k binary inputs for inputting the k data bits $(u=u_1, \ldots, u_k)$ and M binary outputs for outputting M intermediate values determined from the k data bits, and
    a second subcircuit for transforming the intermediate values $(z_1, \ldots, z_M)$ into the m check bits $c_1, \ldots, c_m$, where $m < M$ and $M < k$,
    wherein the first subcircuit is configured to determine the intermediate values from the k data bits such that there is an association between a determined pair of intermediate values for each data bit $u_j$ that is to be corrected, such that a change in the pair of intermediate values indicates that the j-th data bit $u_j$ has changed to $\bar{u}_j$ when only one data bit from the k data bits $\{u_1, \ldots, u_k\}$ has changed to its negated value,
    wherein the second subcircuit is configured to transform the intermediate values into the m check bits such that the m check bits associated with the intermediate values determined from the k data bits $u_1, \ldots, u_k$ and the m check bits associated with the intermediate values determined from the k data bits inverted in a respective bit from the k data bits that are to be corrected are pairwise different, where $m < M$.

2. The circuit arrangement as claimed in claim 1 for determining the m check bits $c_1, \ldots, c_m$ for the k data bits $u_1, \ldots, u_k$,
    wherein, for the intermediate values $z_1, \ldots, z_M$:

$$z_1 = z_1(u) = z_1(u_1, \ldots, u_k), \ldots, z_M = z_M(u) = z_M(u_1, \ldots, u_k),$$

wherein the intermediate values form at least a first group $G_1 = \{z_{1,1}, z_{1,2}, \ldots, z_{1,M_1}\}$ of $M_1$ intermediate values and a second group $G_2=\{z_{2,1}, z_{2,2}, \ldots, z_{2,M_2}\}$ of $M_2$ intermediate values, which is different than $G_1$, wherein the first group $G_1$ and the second group $G_2$ have different intermediate values, where $2 \leq M_1, M_2 \leq M$, wherein the first subcircuit is configured to determine the intermediate values from the k data bits such that there is an association between a determined pair of intermediate values $z_{1,l_j}, z_{2,m_j}$ for each data bit $u_j$ that is to be corrected, wherein $z_{1,l_j}$ is an intermediate value from the first group $G_1$ and $z_{2,m_j}$ is an intermediate value from the second group $G_2$, which is different than the intermediate value from the first group, so that $$z_{1,l_j}(u_1, \ldots, u_{j-1}, \bar{u}_j, u_{j+1}, \ldots, u_k) = \bar{z}_{1,l_j}(u_1, \ldots, u_{j-1}, u_j, u_{j+1}, \ldots, u_k)$$

$$z_{2,m_j}(u_1, \ldots, u_{j-1}, \bar{u}_j, u_{j+1}, \ldots, u_k) = \bar{z}_{2,m_j}(u_1, \ldots, u_{j-1}, u_j, u_{j+1}, \ldots, u_k)$$

and a change in the pair $z_{1,l_j}, z_{2,m_j}$ to $\bar{z}_{1,l_j}, \bar{z}_{2,m_j}$ when only one data bit from the k data bits $\{u_1, \ldots, u_k\}$ has changed to its negated value indicates that the j-th data bit $u_j$ has changed to $\bar{u}_j$.

3. The circuit arrangement as claimed in claim 2, wherein the first subcircuit is configured such that when only one data bit $u_j$ changes to a negated data bit $\bar{u}_j$ a change takes place in precisely the intermediate values $z_{1,l_j}, z_{2,m_j}$ and no further intermediate value from at least one of the groups $G_1$ and $G_2$ changes.

4. The circuit arrangement as claimed in claim 2, wherein the second subcircuit is configured to transform the intermediate values $z_1, \ldots, z_M$ into the m check bits $c_1, \ldots, c_m$ such that it transforms the intermediate values $z_{j,1}, \ldots, z_{j,M_j}$ from at least the group $G_j$ of intermediate values in which no further intermediate value changes in the event of the change from $u_j$ to $\bar{u}_j$ into the m check bits $$c_{j,1}, \ldots, c_{j,h_j}(z_{j,1}, \ldots, z_{j,k}, \ldots, z_{j,M_j}),$$

so that the m check bits associated with the intermediate values $$z_{j,1}, \ldots, z_{j,k}, \ldots, z_{j,M_j}$$

and the intermediate values $$(\bar{z}_{j,1}, \ldots, z_{j,k}, \ldots, z_{j,M_j}),$$
$$\ldots$$
$$(z_{j,1}, \ldots, z_{j,k}, \ldots, \bar{z}_{j,M_j})$$
$$\ldots$$

and $(z_{j,1}, \ldots, z_{j,k}, \ldots, \bar{z}_{j,M_j})$ which are inverted in a respective bit, are pairwise different.

5. The circuit arrangement as claimed in claim 4, wherein the first subcircuit is configured such that when only one data bit $u_j$ changes to a negated data bit $\bar{u}_j$ a change is made in precisely the intermediate values $z_{1,l_j}, z_{2,m_j}$ and no further intermediate value changes in both groups $G_1$ and $G_2$ and the second subcircuit for transforming the intermediate values $z_1, \ldots, z_M$ into the m check bits $c_1, \ldots, c_m$ is existent, wherein the second subcircuit is configured such that it transforms the intermediate values $z_{j,1}, \ldots, z_{j,M_j}$ from the group $G_j$ of intermediate values, for j=1,2, into the m check bits $$c_{j,1}, \ldots, c_{j,m_j}(z_{j,1}, \ldots, z_{j,k}, \ldots, z_{j,M_j}),$$

so that the m check bits associated with the intermediate values $$z_{j,1}, \ldots, z_{j,k}, \ldots, z_{j,M_j}$$

and the intermediate values $$(z_{j,1}, \ldots, z_{j,k}, \ldots, z_{j,M_j}),$$
$$\ldots$$
$$(z_{j,1}, \ldots, \bar{z}_{j,k}, \ldots, z_{j,M_j})$$
$$\ldots$$

and $(z_{j,1}, \ldots, z_{j,k}, \ldots, \bar{z}_{j,M_j})$ which are inverted in a respective bit, are pairwise different.

6. The circuit arrangement as claimed in claim 1, wherein the intermediate values or the m check bits determined from the intermediate values by the second subcircuit are each check bits from an at least 1-bit-error-correcting code.

7. The circuit arrangement as claimed in claim 6, wherein the m check bits determined from the intermediate values by the second subcircuit are the m check bits from an at least 1-bit-error-correcting code for correcting the intermediate values.

8. The circuit arrangement as claimed in claim 1, wherein the intermediate values determined by the first subcircuit and to be transformed by the second subcircuit are the m check bits from a cross parity code.

9. The circuit arrangement as claimed in claim 1, wherein the intermediate values determined by the first subcircuit and to be transformed by the second subcircuit are the m check bits from a code that, apart from a permutation of the k data bits and a permutation of the m check bits, is a cross parity code.

10. The circuit arrangement as claimed in claim 8, wherein the intermediate values are one or a combination of the following: row parities from a cross parity code, column parities from a cross parity code, diagonal parities from a cross parity code.

11. The circuit arrangement as claimed in claim 1, wherein the second subcircuit is configured to form a subset $\{z_{1'}, \ldots, z_{M'}\}$ of the intermediate values $\{z_1, \ldots, z_M\}$ into a subset $c_{1'}, \ldots, c_{m'}$ of the m check bits in accordance with the relationship $$c_{1'}, \ldots, c_{m'} = H \cdot (z_{1'}, \ldots, z_{M'}),$$

where $\{c_{1'}, \ldots, c_{m'}\}$ are check bits that are associated with the intermediate values $z_{1'}, \ldots, z_{M'}$ and $H=(h_1, h_2, \ldots, h_{M'})$ is a binary (m',M') matrix, wherein $h_i$ is a plurality of m' columns of the binary matrix and are pairwise different for $i=1, \ldots, M'$.

12. The circuit arrangement as claimed in claim 11, wherein the second subcircuit is configured to form a first subset $\{z_{1,1}, \ldots, z_{1,M_1}\}$ of the intermediate values $\{z_1, \ldots, z_M\}$ into a subset $c_{1,1}, \ldots, c_{1,m_1}$ of the m check bits in accordance with the relationship $$c_{1,1}, \ldots, c_{1,m_1} = H \cdot (z_{1,1}, \ldots, z_{1,M_1}),$$

where $\{c_{1,1}, \ldots c_{1,m_1}\}$ are check bits that are associated with the intermediate values $z_{1,1}, \ldots, z_{1,M_1}$ and $H_1=(h_1^1, h_2^1, \ldots, h_{M_1}^1)$ is a binary $(m_1, M_1)$ matrix, the $m_1$-component columns $h_i^1$ of which are pairwise different for $i=1, \ldots, M_1$, and wherein it forms a second subset $\{z_{2,1}, \ldots, z_{2,M_2}\}$ of the intermediate values $\{z_1, \ldots, z_M\}$ into a subset $c_{2,1}, \ldots, c_{2,m_2}$ of the m check bits in accordance with the relationship $$c_{2,1}, \ldots, c_{2,m_2} = H^2 \cdot (z_{2,1}, \ldots, z_{2,M_2}),$$

where $\{c_{2,1}, \ldots, c_{2,m_2}\}$ are check bits that are associated with the intermediate values $z_{2,1}, \ldots, z_{2,M_2}$ and $H^2=(h_1^2, h_2^2, \ldots, h_{M_1}^2)$ is a binary $(m_2, M_2)$ matrix, wherein $h_i^2$ is a plurality of $m_2$ columns of the binary matrix and are pairwise different for $i=1, \ldots, M_2$.

13. The circuit arrangement as claimed in claim 12, wherein the columns of the matrix $H^1$ or $H^2$ have an odd number of ones.

14. The circuit arrangement as claimed in claim 12, wherein the matrix $H^1$ or the matrix $H^2$ is an H matrix for an error correcting linear code.

15. The circuit arrangement as claimed in claim 1, wherein the first subcircuit and the second subcircuit are located on a same support structure.

16. A decoder for determining a subset of data bits that are to be corrected on the basis of m check bits $c_1, \ldots, c_m$, wherein the m check bits $c_1, \ldots, c_m$ are formed by a circuit arrangement for determining the m check bits $c_1, \ldots, c_m$ for k data bits $u_1, \ldots, u_k$, wherein the decoder comprises:
- a first subcircuit having k binary inputs for inputting the k data bits $(u=u_1, \ldots u_k)$ and M binary outputs for outputting M intermediate values $(z_1=z_1(u_1, \ldots, u_k), \ldots, z_M=z_M(u_1, \ldots, u_k))$ determined from the k data bits, and
- a second subcircuit for transforming the intermediate values $(z_1, \ldots, z_M)$ into the m check bits $c_1, \ldots, c_m$, where m<M and M<k,
- a third subcircuit for forming a subset of differences $\Delta c_1 = c_1 \oplus c_1', \ldots, \Delta c_m = c_m \oplus c_m'$ for a plurality of correct check bits $c_1, \ldots, c_m$ and the possibly erroneous check bits $c_1', \ldots, c_m'$, these differences being determined from a plurality of possibly erroneous data bits $u_1', \ldots, u_k'$ and possibly erroneous check bits $c_1', \ldots, c_m'$,
- a fourth subcircuit for forming a subset of differences $\Delta z_1 = z_1 \oplus z_1', \ldots, \Delta z_M = z_M \oplus z_M'$ from error-free intermediate values $z_1, \ldots, z_M$ and possibly erroneous intermediate values $z_1', \ldots, z_M'$, the differences $\Delta z_1, \ldots \Delta z_M$ being determined from the differences in the intermediate values $\Delta c_1, \ldots, \Delta c_m$, and
- a fifth subcircuit for determining a corrected data bit $u_j^{cor}$ having at least three binary inputs for inputting a possibly erroneous data bit $u_j'$ and for inputting two differences $\Delta z_{1,l_j}, \Delta z_{2,r_j}$ from intermediate values and a binary output for outputting the corrected data bit $u_j^{cor}$, wherein $z_{1,l_j}$ belongs to a first group of intermediate values and $z_{2,r_j}$ belongs to a second group of intermediate values, so that when $u_j$ changes to $\overline{u_j}$ and also no error occurs, $z_{1,l_j}$ changes to $\overline{z_{1,l_j}}$ and $z_{2,r_j}$ changes to $\overline{z_{2,r_j}}$, and the fifth subcircuit is designed such that it outputs $u_j^{cor}=u_j \oplus 1$ when $\Delta z_{1,l_j}=\Delta z_{2,r_j}=1$.

17. The decoder as claimed in claim 16, wherein the third subcircuit has k+m binary inputs for inputting k possibly erroneous data bits and $u'=u_1', \ldots, u_k'$ and m possibly erroneous check bits $c'=c_1', \ldots, c_m'$ and m binary outputs for outputting changes $\Delta c=\Delta c_1, \ldots, \Delta c_m$ determined from u' and c',
the fourth subcircuit has m binary inputs for inputting the changes $\Delta c=\Delta c_1, \ldots, \Delta c_m$ and M binary outputs for outputting the changes determined from $\Delta c$ for intermediate values $\Delta z=\Delta z_1, \ldots, \Delta z_M$,
and the fifth subcircuit has k+M inputs for inputting the k possibly erroneous data bits $u'=u_1', \ldots, u_k'$ and M changes in the intermediate values $\Delta z=\Delta z_1, \ldots, \Delta z_M$ and has k', where k'≤k, outputs for outputting a subset of k' from a plurality of k corrected data bits $u_1^{cor}, \ldots, u_k^{cor}$.

18. The decoder as claimed in claim 16, wherein the change $\Delta u_i$ in the data bit $u_i$, where 0≤i≤k, can be presented as a product of at least 2 changes in the intermediate values.

19. The decoder as claimed in claim 16, wherein at least two subcircuits from a set comprising the third subcircuit, the fourth subcircuit and the fifth subcircuit of the decoder are located on a same support structure.

20. A method for determining m check bits $c_1, \ldots, c_m$ for k data bits $u_1, \ldots, u_k$, wherein the method comprises:
determination of M intermediate values from the k data bits, so that there is an association between a determined pair of intermediate values for each data bit $u_j$ that is to be corrected, so that a change in the pair of intermediate values indicates that the j-th data bit $u_j$ has changed to $\overline{u}_j$ when only one data bit from the k data bits $\{u_1, \ldots, u_k\}$ has changed to its negated value, and
transformation of the intermediate values into the m check bits $c_1, \ldots, c_m$,
wherein the intermediate values are transformed into the m check bits such that the m check bits associated with the intermediate values determined from the k data bits and the m check bits associated with the intermediate values determined from the k data bits inverted in a respective bit from the k data bits that are to be corrected differ in pairs, where m<M and M<k.

* * * * *